(12) United States Patent
Tanaka

(10) Patent No.: US 6,781,669 B2
(45) Date of Patent: Aug. 24, 2004

(54) METHODS AND APPARATUSES FOR SUBSTRATE TRANSPORTING, POSITIONING, HOLDING, AND EXPOSURE PROCESSING, DEVICE MANUFACTURING METHOD AND DEVICE

(75) Inventor: Keiichi Tanaka, Funabashi (JP)

(73) Assignee: Nikon Corporation, Tokyo (JP)

( * ) Notice: Subject to any disclaimer, the term of this patent is extended or adjusted under 35 U.S.C. 154(b) by 225 days.

(21) Appl. No.: 09/745,432

(22) Filed: Dec. 26, 2000

(65) Prior Publication Data

US 2001/0006763 A1 Jul. 5, 2001

(30) Foreign Application Priority Data

Dec. 28, 1999 (JP) .......................... 11-375850
Dec. 28, 1999 (JP) .......................... 11-377305
Nov. 17, 2000 (JP) ...................... P2000-351133

(51) Int. Cl.⁷ ................. G03B 27/42; G03B 27/58; G03B 27/60
(52) U.S. Cl. .................. 355/53; 355/72; 355/75
(58) Field of Search .......................... 355/53, 72, 75, 355/77; 414/266, 269, 281, 287, 288

(56) References Cited

U.S. PATENT DOCUMENTS 4,848,536 A * 7/1989 Machida .................... 198/619
5,534,740 A * 7/1996 Higuchi et al. ............. 310/309
5,955,800 A * 9/1999 Shearwood et al. ... 310/40 MM
5,986,381 A * 11/1999 Hoen et al. ................. 310/309
6,160,338 A   12/2000 Ono
6,333,572 B1  12/2001 Ono

* cited by examiner

*Primary Examiner*—Rodney Fuller
(74) *Attorney, Agent, or Firm*—Oliff & Berridge, PLC

(57) ABSTRACT

Methods and apparatuses for transporting a substrate plate efficiently, for positioning the substrate plate to enable to minimize mechanical motions and generation of vibration associated with conventional substrate positioning, and for holding the substrate. For example, the present exposure apparatus has a plurality of electrodes arranged along the baseplate and a transport apparatus having a control apparatus to impress a voltage on each electrode to first generate static charges in the substrate plate, then to impress a voltage on each of the plurality of electrodes so that the charge code of the electrodes is the same as the charge code of the substrate plate, and to switch the voltage on the electrodes in accordance with the time interval required to produce dielectric polarization in the substrate plate. The substrate plate can be transported by electrostatic forces at high speed without contacting the baseplate.

31 Claims, 15 Drawing Sheets

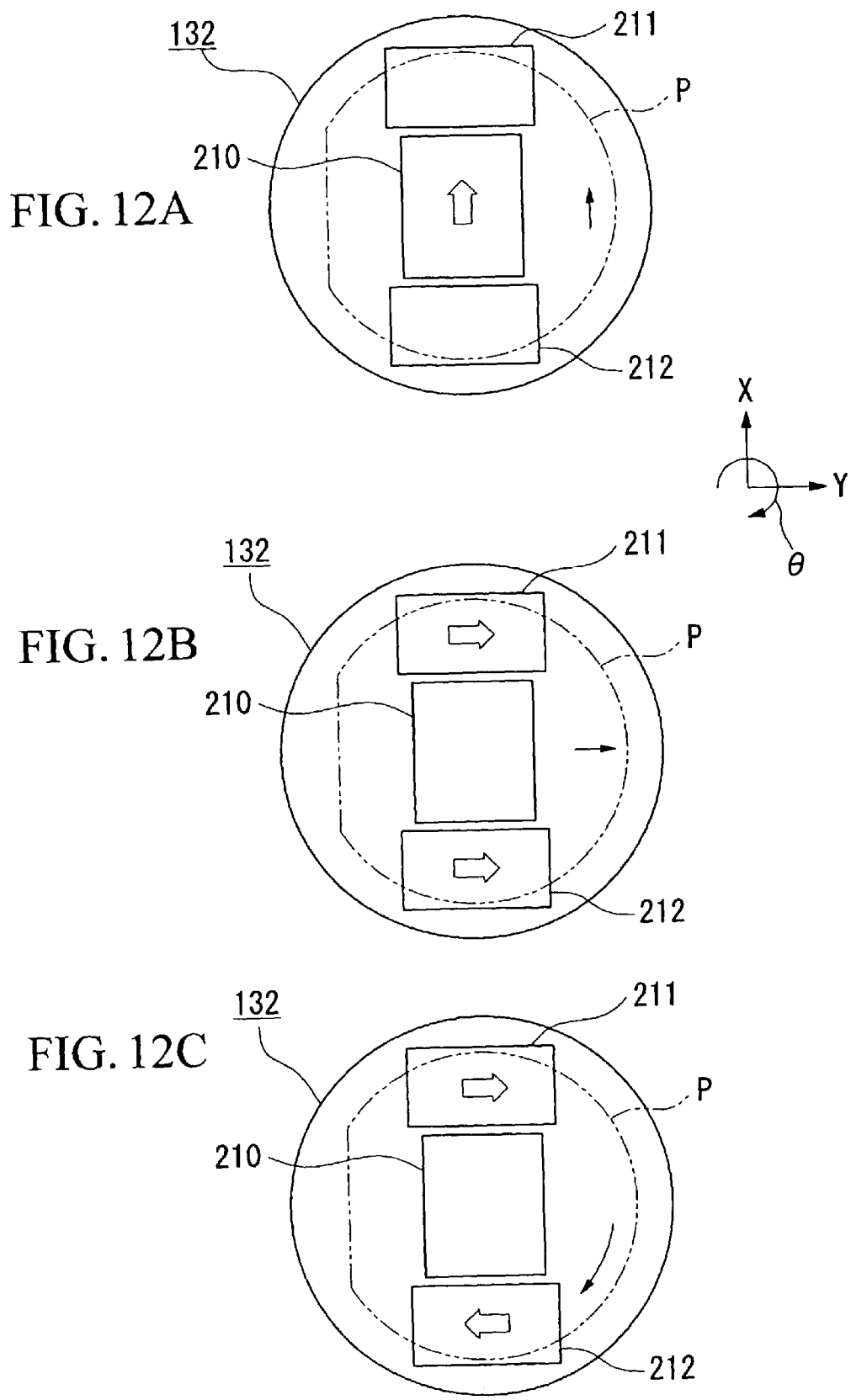

METHODS AND APPARATUSES FOR SUBSTRATE TRANSPORTING, POSITIONING, HOLDING, AND EXPOSURE PROCESSING, DEVICE MANUFACTURING METHOD AND DEVICE

BACKGROUND OF THE INVENTION

1. Field of the Invention

The present invention relates to methods and apparatuses for transporting a substrate plate, positioning a substrate plate on a given plane, holding a substrate plate on a holding surface, and exposure processing a substrate plate, and device manufacturing method and device.

2. Description of the Related Art

In recent years, manufacturing of devices (electronic devices) such as semiconductor elements (integrated circuits and the like) or liquid crystal display panels using photolithographic processes has shown an increasing trend toward the use of in-line photolithographic systems comprised by serially-connected processing apparatuses, such as exposure processing and other substrate processing apparatuses, for example, coaters to apply photosensitive coating such as photo-resist on the substrate plate or developers to develop the substrate plate coated with a photosensitive coating.

In this type of photolithographic systems, the main body of an exposure apparatus, a substrate transport apparatus and substrate handling ports are typically placed inside a storage chamber of the exposure apparatus, while, the main body of a coater/developer and a substrate transport apparatus and others are placed inside a chamber of the coater/developer that provides both functions of applying a photo-sensitive material and developing the exposed substrate. A substrate plate, after receiving certain processing inside the coater/developer is transported by the substrate transport apparatus, by way of the substrate handling port connecting both chambers, for processing in the exposure apparatus. In the meantime, an exposed substrate plate is transported back to the coater/developer again in a reverse order to receive additional processing, or transported out of the exposure apparatus to inspection steps and others.

FIG. 18 shows a conventional exposure apparatus. In this exposure apparatus, the substrate plate P is transported by the transport apparatus 300 to the substrate holding apparatus (referred to as substrate holder below) 321 of the exposure apparatus main body 320. The transport apparatus 300 is provided with a robotic arm 301 for holding a substrate plate P; a guide section 302 for freely movably supporting the robotic arm 301; a loader 303 for loading the substrate plate 2 into the exposure apparatus main body 320; and a loader guide section 304 for freely movably supporting the loader 303. The robotic arm 301 and the loader 303 have a vacuum suction cavity for holding the substrate P, and are installed so that they may be moved along the respective guide sections by the action of a rotation motor and a ball screw linked to the rotation motor.

The robotic arm 301 receiving the substrate P through the port PT1 transports the substrate P to a position PS1. At the position PS1, there is provided a first pre-alignment mechanism 305 serving as the first positioning apparatus. The first pre-alignment mechanism 305 is provided with a freely rotatably supported turntable, for example, and a position detection mechanism for detecting the position of the substrate P, and is constructed so as to adjust the position in the rotation direction of the substrate P at the position PS1. After the position of the substrate P is adjusted in the rotation direction, the substrate P is transported by the loader 303 along the loader guide 304 to position PS2. In position PS2, the substrate P is adjusted in the horizontal direction (x-y direction) by the second pre-alignment mechanism 306 serving as the second positioning apparatus, after which, it is held in the substrate holder 321 of the exposure apparatus main body 320. The second pre-alignment mechanism 306 is comprised by a mechanism having a pin that can be moved to abut the substrate P, and is provided as a part of the transport apparatus such as the loader 303, for example. The substrate holder 321 holding the substrate P moves to place the substrate P in the path of illumination light of the exposure apparatus main body 320. Then, illumination light for exposure processing is emitted in the exposure apparatus main body 320 to imprint a circuit pattern fabricated on the mask onto the substrate P. Here, substrate positioning operations using the first and second pre-alignment mechanisms are performed to increase the precision of optical alignment during the actual exposure operation.

The mechanism based on moving the robotic arm 301 by a rotation motor and ball screw arrangement, as described above, tends to increase the size of the overall transport apparatus 300, and therefore, it is necessary to reserve a large installation space. Also, because the system is designed to transfer a substrate P between the robotic arms using vacuum-chucking, the motion is time-consuming and results in lowering the efficiency of manufacturing in some cases. Furthermore, when the transport speed is increased in the transport mechanism based on a rotation motor and ball screw arrangement, there is a danger of generating vibrations and stable transport is difficult to achieve sometimes.

Also, as in the conventional exposure apparatus described above, when it is desired to hold the substrate plate in the substrate holding apparatus, if positioning (pre-alignment) is performed using mechanical motions, vibration from the positioning action is transmitted to the exposure apparatus main body, resulting in a loss of precision in positioning the substrate plate. To improve the productivity of the exposure apparatus, it is often practiced that a plurality of substrate holding apparatuses are prepared so that while one substrate plate on the plate holder is being exposed, the next substrate plate is placed on another plate holder. Therefore, if vibrations are generated by pre-aligning motions, a serious concern is raised that the vibrations are transmitted to mechanical parts to affect the precision of exposure.

Further, as in the conventional positioning apparatus described above, when the substrate plate is positioned mechanically, other problems can also arise such as the necessity for allocating equipment space and devising a complex mechanism. Also, in the conventional exposure apparatuses, after positioning (pre-aligning) the substrate plate mechanically using the pre-alignment mechanism (positioning device), substrate holding is performed by the substrate holding apparatus. For this reason, time is consumed in carrying out mechanical positioning operation itself.

The present invention is provided in view of the background information described above, and a first object of the present invention is to provide a method and an apparatus for transporting the substrate plate efficiently while providing a more compact transport apparatus, and to provide a method and an apparatus for exposure to enable high production efficiency.

The second object of the present invention is to provide a method and an apparatus for positioning the substrate plate to enable to reduce the number of mechanical movements required for positioning so as to control the generation of vibration as well as to make the apparatus more compact and to enable to perform the tasks in shorter time, and a method and an apparatus for holding the substrate plate, and a method and an apparatus for exposing the substrate plate using the apparatuses demonstrated.

The third object of the present invention is to provide a method and an apparatus for exposure processing to enable to produce high precision devices and to improve exposure precision of patterns for actual device, and a method for fabricating high performance devices.

SUMMARY OF THE INVENTION

To resolve the topics discussed above, the present invention provides the following structures illustrated in FIGS. 1~17.

The present method relates to transporting a substrate plate (P) along a transport plane (3) by inducing electric charges in the substrate plate by impressing a voltage on each of a plurality of electrodes (4) arranged along the transport plane (3), and impressing a voltage on each of the plurality of electrodes (4) so as to generate in the plurality of electrodes (4) an electrode charge code identical to a plate charge code induced in the substrate plate (P) to levitate the substrate plate against the transport plane (3) by electrostatic forces; and switching the voltage impressed on each of the plurality of electrodes (4) in accordance with a time interval (Tp) required for producing dielectric polarization in the substrate plate (P).

According to the present method, the substrate plate (P) in the electric charge state is levitated against the transport plane (3) due to electrostatic forces generated by impressing the electrodes (4) with a voltage such that the charge code of the substrate plate (P) is identical to the charge code of the electrodes (4). Then, by switching the voltage impressed on the electrodes (4) arranged along the transport plane (3) in such a way to alter the charge code on each electrode (4), the substrate plate (P) is subjected to a force acting in the transport direction (y-direction). The result is that the substrate plate (P) is transported without contacting the transport plane (3). Because the substrate plate (P) does not contact the transport plane (3), the substrate plate (P) is able to be transported at high speed while suppressing generation of vibration. The present invention thus enables a highly effective transport operation.

In this case, by setting a cycle (Td) for switching the voltage to be shorter than a polarization time constant (T) of the substrate plate, the levitated state of the substrate plate (P) against the transport plane (3) is maintained in a stable manner. That is, because the substrate plate (P) is transported while maintaining the non-contact state, it enables high speed transport while suppressing vibration.

The method is enabled by an apparatus (H) for transporting a substrate plate (P) along a transport plane (3) comprised by: a plurality of electrodes (4) arranged along the transport plane (3); and a control apparatus (9) for inducing electric charges in the substrate plate (P) by impressing a voltage on each of a plurality of electrodes (4) arranged along the transport plane (3), and impressing a voltage on each of the plurality of electrodes (4) so as to generate an electrode charge code identical to a plate charge code induced in the substrate plate (P), and switching the voltage impressed on the plurality of electrodes (4) in accordance with a time interval (Tp) required for producing dielectric polarization in the substrate plate (P).

In this case, a gas supply apparatus (10) for supplying a gas is provided between the substrate plate (P) and the transport plane (3), and by supplying the gas between the substrate plate (P) and the transport plane (3) using the gas supply apparatus (10), the substrate plate (P) is levitated against the transport plane (3) in a stable manner. Therefore, the substrate plate (P) can be transported high speed while maintaining the non-contact state, and a highly effective transport operation is achieved reliably.

In this case, by providing on the transport plane (3), a plurality of second electrodes (5) arranged at right angles (x) to a direction (y) of the arrangement of the electrodes (4) on the transport plane (3), position control is possible in the direction (x) at right angles to the transport direction (y) of the substrate plate (P). It follows that the substrate plate (P) can be transported in a stable manner. In this case, by arranging the second electrodes on both lateral sides of the electrodes, position control becomes even more stable.

The present method for positioning a substrate plate (P) on a specific plane (200) is comprised by: a first step for inducing electric charges in the substrate plate by impressing a voltage on each of a plurality of electrodes (ELD) arranged on the plane (200); a second step for impressing a voltage, that is different than the voltage impressed in the first step, on the plurality of electrodes (ELD) so as to levitate the substrate plate (P) on the plane (200) by electrostatic forces; and a third step for moving the substrate plate (P) in a specific direction while switching the voltage impressed on each of the plurality of electrodes (ELD).

According to the positioning method described above, by applying a specific voltage on each of a plurality of electrodes (ELD) on a electrically charged substrate plate (P), the substrate plate (P) is levitated due to electrostatic forces. Then, by switching the voltage impressed on each of the plurality of electrodes (ELD) arranged along the plane (200), the substrate plate (P) moves to a specific position in the levitated state against the plane (200). Therefore, it enables to position the substrate plate (P) on the specific plane (200) virtually without any mechanical operation. Therefore, the method enables to suppress generation of vibration associated with positioning.

In this case, by switching the voltage in accordance with a time interval required for producing dielectric polarization in the substrate plate, the levitated state of the substrate plate (P) can be maintained in a stable manner.

In this case, a chucking of the substrate plate (P) that has been moved to a specific position on the plane (200) due to electrostatic forces enables the substrate plate (P) to be held reliably in the specific position. Furthermore, because the same electrodes (ELD) are used for the chucking as well as for positioning of the substrate plate (P), the apparatus can be made more compact and processing times can be shortened.

In this case, a gas for levitating the substrate plate (P) may be supplied between the substrate plate (P) and the plane (200). By so doing, levitation of the substrate plate (P) can be carried out in an even more stable manner.

The above method of positioning the substrate plate (P) is carried out by using an apparatus (132) for transporting a substrate plate (P) along a specific plane (200) comprised by: a plurality of electrodes (ELD) arranged along the plane (200); and a control apparatus (9) for inducing electric charges in the substrate plate (P) by impressing a voltage on each of the plurality of electrodes (ELD) arranged along the plane (200), and then switching the voltage impressed on each of the plurality of electrodes (ELD) in accordance with a time interval required for producing dielectric polarization in the substrate plate.

In this case, by providing a first electrode section (210) having the plurality of first electrodes (ELD) arranged in a first direction, and a second electrode section (211) having the plurality of second electrodes (ELD) arranged in a second direction at right angles to the first direction, the substrate plate (P) can be positioned on the specific plane (200) in two-dimensional directions. Therefore, positioning of the substrate plate (P) can be carried out even more reliably.

In this case, the second electrode sections (211, 212) may be distributed in a direction at right angles to the second direction in separate groups. By so doing, the driving forces from the second electrode sections (211, 212) for the substrate plate (P) may be made to oppose each other, so as to provide a rotational force to correct the position of the substrate plate (P) in the rotation direction.

In this case, by providing an insulating member (203) may be disposed between the substrate plate (P) and the plane (200), dielectric polarization of the substrate plate (P) may be carried out in a stable manner.

In this case, by providing a gas supply apparatus for supplying a gas between the substrate plate (P) and the plane (200), levitation of the substrate plate (P) against the plane (200) may be carried out in a stable manner.

The present method for holding a substrate plate (P) on a holding surface (200) is used in association with the positioning method described above for positioning the substrate plate (P) on the holding surface (200). According to this method for holding the substrate plate (P), because the substrate plate (P) is positioned on the plane (200) using the electrostatic forces, processing time can be shortened compared to cases of positioning the substrate plate (P) in other positions.

Also, the present apparatus for holding a substrate plate (P) on a holding surface (200) is used in association with an apparatus (132) for positioning recited in above for positioning the substrate plate (P) on the holding surface (200). According to the apparatus for holding the substrate plate (P), it becomes possible to construct an apparatus having both functions of positioning and holding a substrate plate (P) so that an apparatus having both functions may be made more compact.

Also, the present method for exposure is used in association with a method described above for transporting a substrate plate (P) to a path of the illumination light (EL). In this case, the transport efficiency is improved, leading to improvement in the efficiency of overall manufacturing process. Further, the method for exposure includes positioning a substrate plate in a path of the illumination light using a method of positioning or a method of holding a substrate plate (P) described above. In this case, by suppressing the vibration accompanying the positioning operations, exposure precision of actual device structure is improved. Also, the present exposure apparatus includes a transport apparatus (H) described above for transporting a substrate plate (P) to a path of the illumination light (EL). Also, the present exposure apparatus includes a substrate positioning and holding apparatus (132) for positioning and holding a substrate plate (P) on the plane (200).

The present method for manufacturing a device includes a photolithographic step in which a method of exposure described above is applied. In this case, the present invention enables high precision fabrication of patterns on the device, and the precision of the manufactured device is improved. Also, the present device is manufactured by using an exposure apparatus described above.

BRIEF DESCRIPTION OF THE DRAWINGS

FIG. 12A is a plan view to explain the positioning operation of the positioning apparatus and the substrate holding apparatus shown in FIG. 9.

FIG. 12B is a plan view to explain the positioning operation of the positioning apparatus and the substrate holding apparatus shown in FIG. 9.

FIG. 12C is a plan view to explain the positioning operation of the positioning apparatus and the substrate holding apparatus shown in FIG. 9.

DESCRIPTION OF THE PREFERRED EMBODIMENTS

Figure 1:
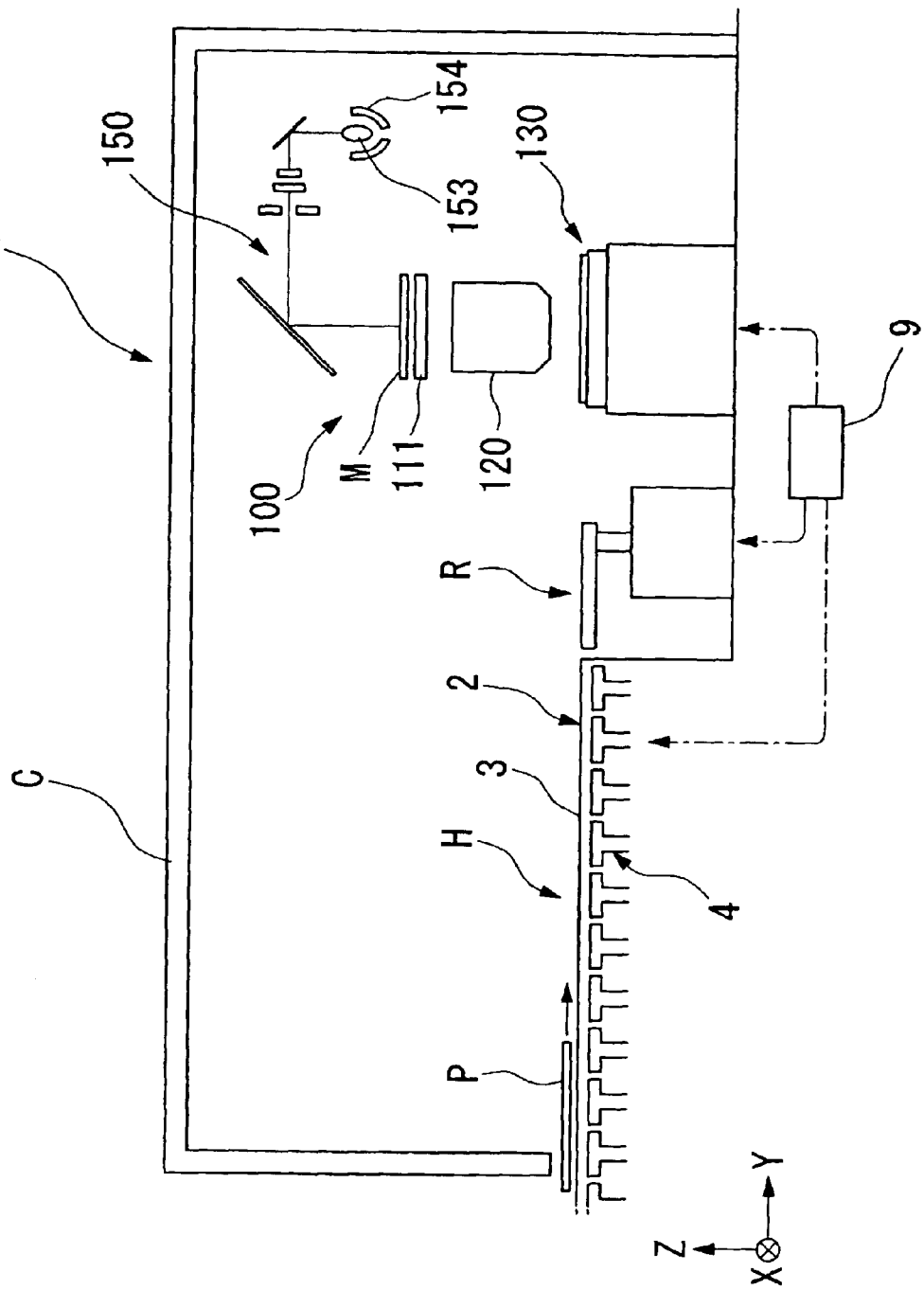
FIG. 1 is a schematic diagram to show a first embodiment of the exposure apparatus provided with the transport apparatus of the present invention.
Figure 2:
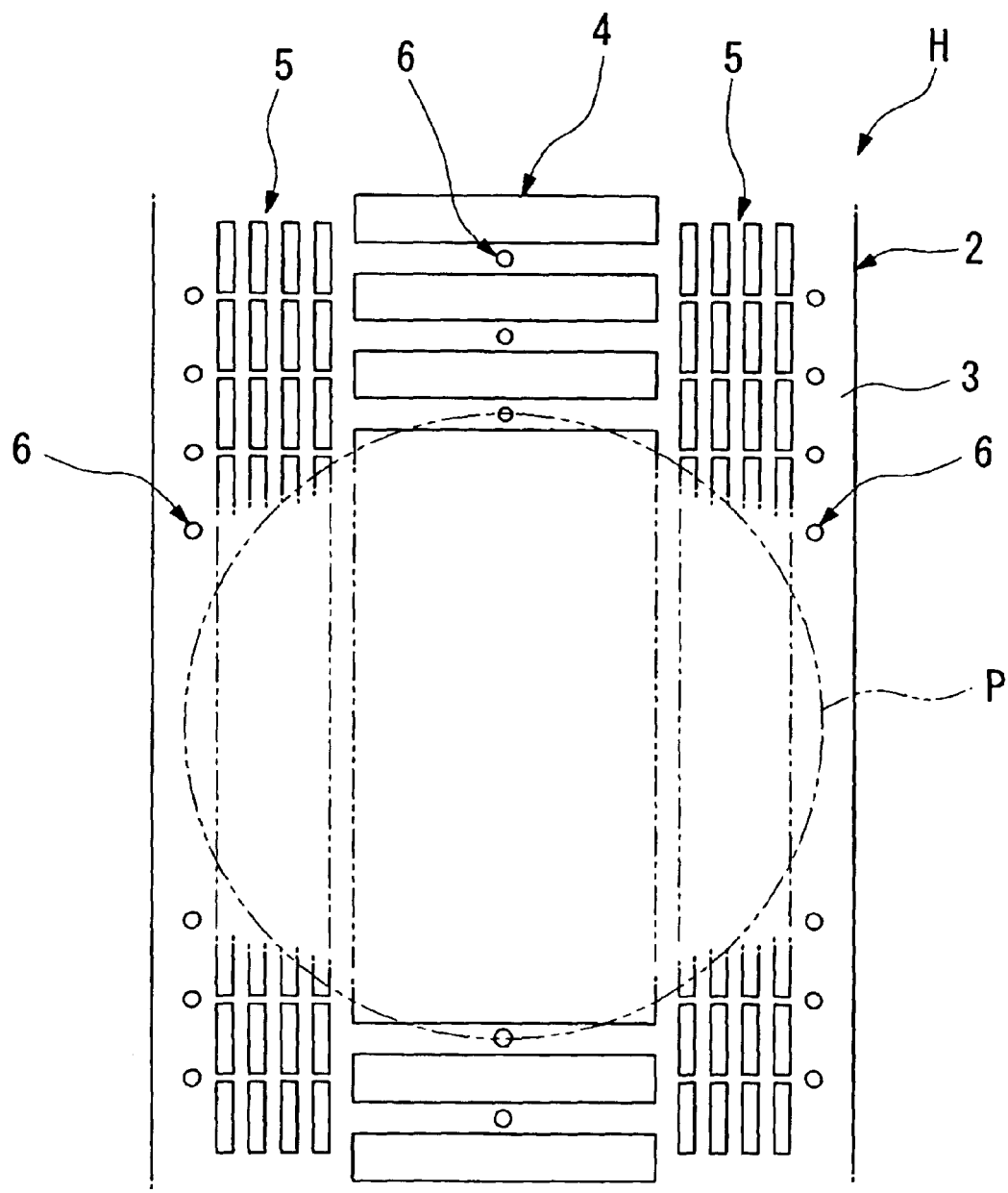
FIG. 2 is a plan view of the transport apparatus of the present invention.
Figure 3A:
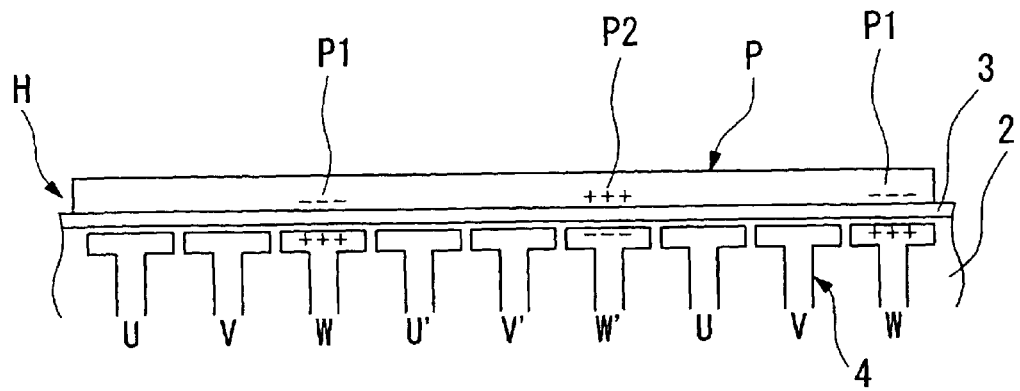
FIG. 3A is an enlarged cross sectional view of the key parts of the transport apparatus to explain the operation of transporting the substrate plate.
Figure 3B:
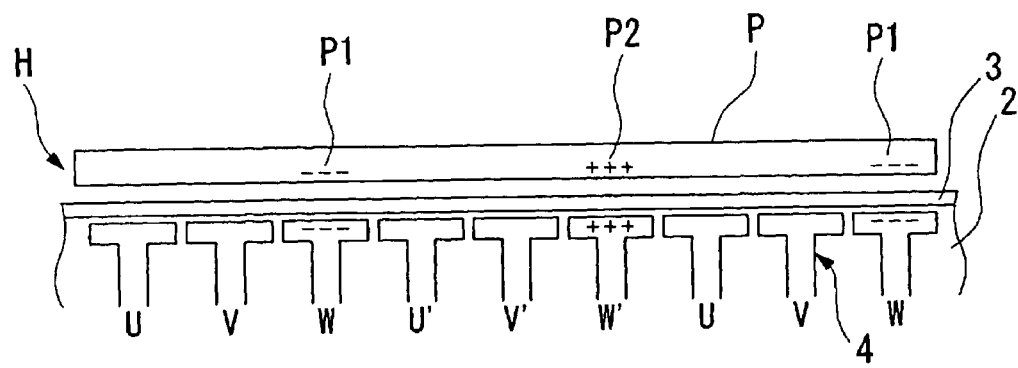
FIG. 3B is an enlarged cross sectional view of the key parts of the transport apparatus to explain the operation of transporting the substrate plate.
Figure 3C:
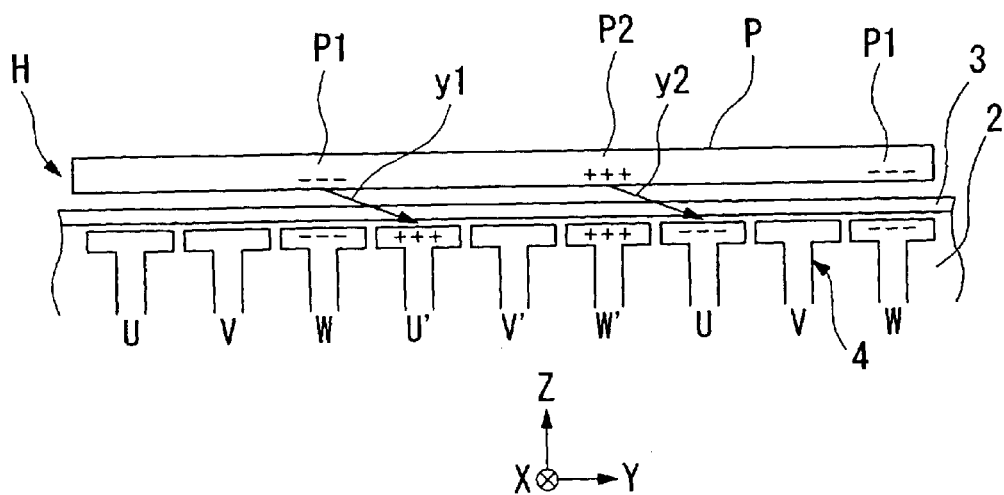
FIG. 3C is an enlarged cross sectional view of the key parts of the transport apparatus to explain the operation of transporting the substrate plate.
Figure 4:
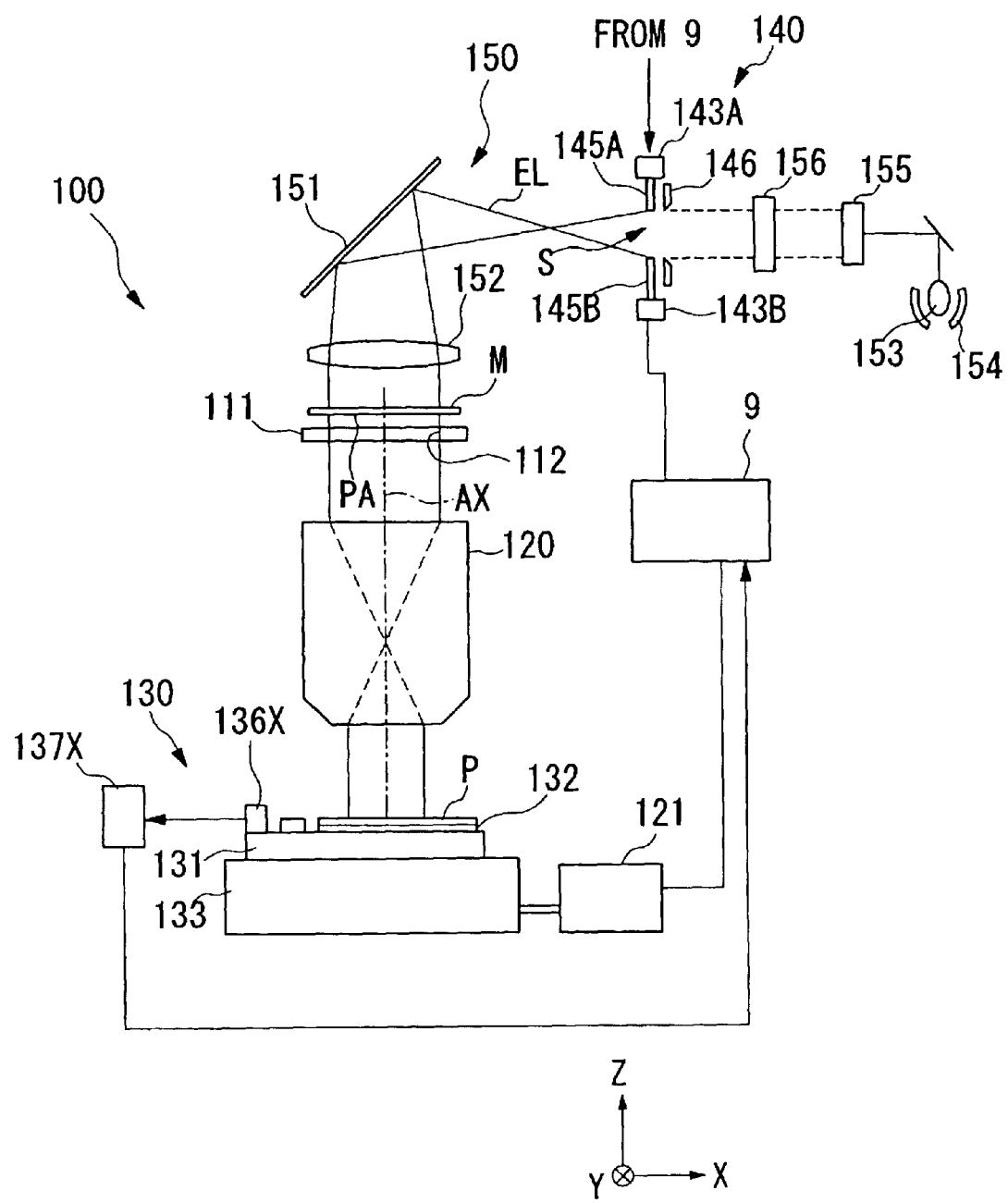
FIG. 4 is a diagram to explain the exposure apparatus main body.

Preferred embodiments of the transport method and apparatus, positioning method and apparatus, substrate plate holding method and apparatus, exposure method and apparatus, and device manufacturing method and device according to the present invention will be explained in the following with reference to the drawings. FIG. 1 is a schematic diagram of an exposure apparatus 1 having a transport apparatus H of the present invention. FIG. 2 is a plan view of the transport apparatus H, and FIGS. 3A to 3C are enlarged cross sectional views of key parts of the transport apparatus H. FIG. 4 is a structural diagram of the exposure apparatus main body.

In these diagrams, the exposure apparatus 1 is comprised by: the transport apparatus H for transporting the substrate plate P; an exposure apparatus main body 100 for performing exposure processing on the substrate P; and a load/unload section R for handling the substrate P between the transport apparatus H and the exposure apparatus main body 100, all of which are housed in a chamber C. Overall operation of the exposure apparatus 1 having the transport apparatus H is carried out according to the commands from the control apparatus 9.

The substrate P represents, for example, a semiconductor wafer of a given properties, and, after a photo-resist coating is applied by the coater/developer, it is transported by the transport apparatus H to the exposure apparatus main body 10, where it is given exposure processing.

The transport apparatus H is used for transporting the substrate plate P between the exposure apparatus main body 100 and the substrate storage section (not shown) for storing the substrate plates P, or between the main body 100 and a port (not shown) disposed between the coater/developer and the exposure apparatus 1. The transport apparatus H is comprised by a transport apparatus main body 2 having a baseplate (transport plane) 3 extending along the transport direction (y-direction), and a plurality of electrodes 4 disposed below the baseplate 3 (-z-direction). The baseplate 3 comprises an insulating member made of an insulating material such as a polymeric resin, for example, and the substrate plate P is designed to be transported above the baseplate 3.

A number of electrodes 4 are provided below the baseplate 3, and as shown in FIG. 2, each electrode 4 is shaped rectangular in the plan view. In this case, the corners of the rectangular shaped electrode 4 can be rounded to avoid concentrating electrical charges. The electrodes 4 are disposed so that the longitudinal direction extends in the transport direction (y-direction) and in the vertical direction (x-direction), and are separated at a specific spacing in the transport direction. Also, the electrode 4 is provided in the central section along the x-direction of the baseplate 3, and the longitudinal dimension (x-direction) of the electrode 4 is selected according to the size of the substrate plate P to be transported.

Each electrode 4 is connected to a power source (not shown). The power source impresses a specific voltage on each electrode, and is designed to impress a specific individual voltage to each electrode independently. Further, the power source is able to switch the polarity of the impressed voltage on the electrode 4. Specifically, each electrode 4 is impressed with an alternating current (ac) voltage. Also, as shown in FIGS. 3A to 3C, a plurality of electrodes 4 are operated as a three phase circuit along the transport direction as U, V, W, U', V', W' . . . to provide different polarities for each group of three electrodes.

As shown in FIG. 2, second electrodes 5 are provided on both lateral sides of the electrode 4 in the x-direction. Each second electrode 5, similar to the electrode 4, is formed into a rectangular shape in its plan view, and the electrodes 5 are provided at a given spacing in the perpendicular direction (x-direction) to the longitudinal direction of the electrodes 4 (y-direction). These second electrodes 5 are also connected to a power source (not shown), and is designed to impress a specific independent voltage to each electrode 5. Specifically, similar to the electrodes 4, ac voltage is impressed. The second electrodes 5 are spaced according to the size of the substrate plate P to be transported. In this case, the second electrodes 5 are placed below the peripheral section of the substrate plate P to be transported.

Also, the baseplate 3 is provided with a position detection apparatus 6 to detect the position and direction of the substrate plate P being transported. The position detection apparatus 6 comprises a laser displacement sensor, for example, and is placed along the transport direction (y-direction) of the baseplate 3 at a given spacing. The position detection apparatus 6 is provided between the respective electrodes 4 and on the outside of the second electrodes 5, and detects a position of the substrate plate P on the baseplate 3 by receiving the reflected light of a locating beam radiated on the substrate plate P being transported on the baseplate 3. Output signals from the position detection apparatus 6 are input in the control apparatus 9.

The position detection apparatus may be comprised, for example, by a CCD sensor placed above the baseplate 3 over which the substrate plate P is transported.

As shown in FIG. 4, the exposure apparatus main body 100 is provided with an illumination system 150 to illuminate a mask M held in the mask stage 111 with the light flux from the light source 153; a blind section 140 that defines the illumination area of the mask M for transmitting that portion of illumination light for exposure processing (exposure light) EL, by adjusting the area of an opening S in the illumination system 150; a projection optical system 120 for projecting an image of the masking pattern of the mask M illuminated by the exposure light EL on the substrate plate P that has been coated with a photo-sensitive agent; a substrate holder 132 for holding the substrate plate P; and a substrate stage 130 for supporting the substrate holder 132.

The illumination system 150 is comprised by, for example; a light source 153 such as a mercury lamp; a parabolic lens 154 for condensing the exposure light emitted from the light source 153; an input lens 155 for converting the condensed exposure light into a substantially parallel light flux; a flyeye lens 156 for receiving the light flux emitted from the input lens 155 and generating a numerous two-dimensional light source at the focusing plane on the rear side (mask M side); and a condenser lens system for condensing the exposure light emitted from the two-dimensional light source and illuminating the mask M with uniform illuminance.

Here, the light source 153 may be comprised by a fluorine laser ($F_2$ laser) emitting at 157 nm, a krypton dimer laser ($Kr_2$ laser) emitting at 146 nm, or an argon dimer laser ($Ar_2$ laser) emitting at 126 nm, for example. The light source 153 may also be comprised by an ArF excimer laser emitting at 193 nm.

The blind section 140 is comprised by, for example: a pair of L-shaped blades 145A, 145B to form a rectangular shaped opening S by being assembled on an plane oriented at right angles to an optical axis AX of the exposure light EL; and a blade movers 143A, 143B for displacing the blades 145A, 145B within a plane that crosses the optical axis AL at right angles according to instructions from the control apparatus 9. In the vicinity of the movable blades 145A, 145B, a fixed blind 146 having an opening of a fixed shape is provided. The fixed blind 146 is a field-of-view aperture surrounding a rectangular opening by means of four knife edges, for example, and the depth in the vertical direction of the rectangular opening is specified by the blades 145A, 145B. In this case, the size of the opening S is changed according to displacements of the blades 145A, 145B, and the opening S selects only that portion of the exposure light EL, that is emitted from the flyeye lens 156 and passed through the opening S, to be sent to the condenser lens 152 by way of the reflection mirror 151. The exposure light EL defined by the opening S illuminates a specified region (pattern region) PA of the mask M held in the mask stage 111 through the condenser lens 152 with substantially uniform illuminance. Such optical components and the blind section 140 are disposed in a given positional relationship, and the blind section 140 is disposed in a conjugate plane with respect to the pattern surface of the mask M.

The mask stage 111 is used to mount the mask M for performing the exposure operation, and the pattern PA formed on the mask M is imprinted on the substrate plate P placed on the substrate stage 130 through the projection optical system 120.

The mask stage 111 has an opening 112 to correspond to the region where the pattern PA is formed on the mask M, and is able to produce micromovement in the x-, y- and θ-direction (rotational direction about the z-axis). The driving mechanism for the mask stage 111 is comprised, for example, by two sets of voice coil motor, and is operated in accordance with instructions from the control apparatus 9. The control apparatus 9 determines the position of the mask M by moving the mask stage 111 so that the center (mask center) of the region of the pattern PA is aligned with the optical axis of the projection optical system 120.

The projection optical system 120 is used to focus an image of the pattern PA, placed inside the illumination range of the exposure light EL specified by the opening S, on the substrate plate P so as to expose the pattern PA on a specific region (shot region) of the substrate plate P. The projection optical system 120 is comprised by sealing a number of optical members, such as lenses and reflective mirrors comprised by fluoride compound crystals such as fluorite and lithium fluoride, in the projection housing.

The substrate stage 130 has a substrate table 131 mounted with a substrate holder 132 serving as a substrate holding device; and an x-y stage apparatus 133 for movably supporting the substrate table 131 in two dimensional directions within the x-y plane. In this case, the optical axis AX of the projection optical system 120 coincides with the z-direction which intersects the x-y plane at right angles. That is, the x-y plane is orthogonal to the optical axis AX of the projection optical system 120. Also, the substrate holder 132 on the substrate stage 130 has a vacuum suction hole for vacuum chucking of the substrate plate P, and the substrate plate P transported to the substrate holder 132 is vacuum chucked by the substrate holder 132.

The position of the substrate stage 130 in the x-y direction can be adjusted by a laser interferometric system. In more detail, at the −x side of the end section of the substrate stage 130 (substrate table 131) comprised by a flat mirror is disposed an x-movement mirror 136X extending in y-direction. A measuring beam from an x-axis laser interferometer 137X is projected essentially vertically to the x-movement mirror 136X, and the reflected light therefrom is received in the detector inside the x-axis laser interferometer 137X, and the position detection system is designed so that, with reference to the position of the reference mirror located inside the x-axis laser interferomter 137X, the position of the x-movement mirror 136X, that is, the position of the substrate plate P on corresponding x-axis is detected. Similarly, though omitted from the diagram, at the end section of the substrate stage 130 on the +y side is disposed a y-movement mirror comprised by a flat mirror extending in x-direction. And, similar to the case described above, the position of the y-movement mirror is detected by the y-axis laser interferometer through the y-movement mirror, that is, the position of the substrate plate P on corresponding y-axis is detected. The detected values (measured values) of the laser interferometers on corresponding x- and y-axes are sent to the control apparatus 9.

On the other hand, the z-direction position of the substrate plate P disposed within the projection region of the projection optical system 120 is detected by a multi-focus position detection system (not shown) which is one of the focal point detection systems based on the injection light method. The detected value, that is, the position information in the z-direction, is sent to the control apparatus 9.

The control apparatus 9, while monitoring the position information of the substrate plate P in the xy-direction and z-direction obtained by the later interferometer system and the multi-focus position detection system, drives the xy-stage apparatus 133 and the substrate table 131 by means of the substrate stage driving apparatus 121 serving as the driving system and determines the position of the substrate plate P in the xy-direction, z-direction and inclinatory direction so that the pattern surface of the mask M and the surface of the substrate plate P will be conjugate with respect to the projection optical system 120, and so that the focusing plane of the projection optical system 120 will be matched with the substrate plate P. When the substrate plate P is positioned properly by following such a positioning process and when the region of the pattern PA of the mask M is illuminated with substantially uniform illuminance, an image of the pattern of the mask M is focused, through the projection optical system 120, on the substrate plate P having a photo-resist coating applied to its surface.

A method of imprinting an image of the pattern of the mask M using the exposure apparatus 1 having the transport apparatus H described above will be explained in the following.

Here, the exposure method of the present invention is comprised by: a step 1 for charging the substrate plate P supplied to the transport apparatus H; a step 2 for levitating the charged substrate plate P with respect to the baseplate 3 of the transport apparatus H using the electrostatic forces; a step 3 for transporting the levitated substrate plate P towards the exposure apparatus main body 100; a step 4 for loading the substrate plate P onto the substrate holder 132 provided on the exposure apparatus main body 100; and a step 5 for radiating the exposure light on the substrate plate P held on the substrate holder 132 so as to imprint the pattern of the mask M to the substrate plate P.

<Step 1>

As shown in FIG. 1, a photo-resist coated substrate plate P is supplied from, for example, the substrate storage section (not shown) or a port (not shown) provided between the coater/developer and the exposure apparatus 1. When the substrate plate P is placed on the baseplate 3 of the transport apparatus H, the control apparatus 9 commands the power source to apply a specific voltage on a specific electrode 4 of the plurality of electrodes 4. The electrode 4 receiving the specific voltage accumulates an amount of electrical charge specified by a code that corresponds to the specific voltage. In this case, the control apparatus 9 impresses a voltage so as to charge the electrode W to a positive polarity and the electrode W' to a negative polarity, as shown in FIG. 3A.

The substrate plate P is placed in contact with the baseplate 3, which is an insulator, and undergoes dielectric polarization by the action of the electrodes W, W'. Therefore, a position P1 of the substrate plate P corresponding to electrode W is charged to a negative polarity, as shown in FIG. 3A, and the position P2 of the substrate plate P corresponding to electrode W' is charged to a positive polarity.

Here, the charging interval required for producing dielectric polarization in the substrate plate P is governed by the physical properties of the substrate plate P. Also, the data related to the duration required for dielectric polarization of the substrate plate P are obtained by means including experimentation, and the results are stored in the control apparatus 9 along with the properties of the substrate plate P.

<Step 2>

When the substrate plate P undergoes dielectric polarization, and both locations facing the electrodes W, W' at the respective positions P1, P2 are charged, the control apparatus 9 applies voltages to the electrodes W, W' so that the charging codes for the electrodes W, W' are different from those used in step 1, as shown in FIG. 3B. That is, voltages are impressed, respectively, so that the electrode W is charged to a negative polarity and the electrode W' to a positive polarity. In so doing, the electrode W, W' are charged with voltages so as to produce respectively the same codes (polarities) as those codes (polarities) of electrical charges generated at the positions P1, P2.

In other words, both the electrode W and the position P1 of the substrate plate P facing the electrode W become negative, resulting that both are charged to the same charge code. On the other hand, both the electrode W' and the position P2 of the substrate plate P facing the electrode W' become positive, resulting that both are charged to the same charge code. Then, the substrate plate P and the electrodes W, W' are subjected to repulsive forces caused by the electrostatic forces, and the substrate plate P is levitated away from the baseplate 3, due to the repulsive forces thus generated.

Here, the values of the voltage impressed on each electrode 4 in steps 1, 2 are pre-determined according to the properties and size (weight) of the substrate plate P, and are chosen so as to meet the need for levitating the substrate plate P. That is, the electrostatic forces are determined according to the necessity to levitate the substrate plate P including the size and other factors, and the amount of charge (electric variable) to be given is obtained according to the magnitude of the electrostatic forces required. Then, the voltage (voltage value) to be impressed to obtain the necessary amount of electrical charge is selected. The data related to the voltage are obtained by experiments and the like beforehand, and the data are stored in the control apparatus 9.

<Step 3>

When the substrate plate P levitates against the baseplate 3 due to electrostatic forces, the control apparatus 9 impresses a specific voltage on the electrode 4 to transport the substrate plate P. In this case, as shown in FIG. 3C, the voltage is impressed on the electrodes U, U' located downstream (+y side in the transport direction) of the electrode W, W' that were impressed with voltages in step 2. Furthermore, the control apparatus 9 impresses voltages so that the codes of the applied voltages are opposite to those that are already on the charged substrate plate P. That is, because the position P1 of the substrate plate P corresponding to electrode W has a negative charge code, the control apparatus 9 impresses a voltage on the electrode U', disposed downstream to the transport direction at position P1, so as to produce a positive charge code. Also, because the position P2 of the substrate plate P corresponding to electrode W' has a positive charge code, the control apparatus 9 impresses a voltage on the electrode U, disposed downstream to the transport direction at position P2, so as to produce a negative charge code. Here, it is arranged so that the absolute values of the impressed voltages on the electrode U, U' are the same as the absolute values of the voltages applied to the electrodes W, W'.

Then, a force of attraction operates between the position P1 of the substrate plate P and the electrode U' due to an attractive force of static electricity, and, as shown in FIG. 3C, a force in the direction shown by an arrow y1 operates on the position P1. Similarly, a force of attraction operates between the position P2 of the substrate plate P and the electrode U due to an attractive force of static electricity, and a force in the direction shown by an arrow y2 operates on the position P2. Therefore, the entire substrate plate P is moved towards the transport direction (positive y-direction).

After the substrate plate P moves in the transport direction Y due to electrostatic forces, when the negatively charged position P1 comes opposite to the electrode U' charged to a positive polarity, forces caused by the electrostatic forces operate on position P1 to attract it towards the electrode U'. Similarly, the positively charged position P2 comes opposite to the electrode U charged to a negative polarity, forces caused by the electrostatic forces operate on position P2 to attract it towards the electrode U.

In this transport process, the substrate plate P can be kept levitated by switching the impressed voltage within a certain time span measured of the time the position P1 of the substrate plate P comes opposite to the electrode U' (or the time the position P2 is opposite to the electrode U) so that the altered charge code of electrode U' (or electrode U) is different than the charge code existing therein.

Timing for switching the impressed voltage is determined by the polarization time constant in the substrate plate P. The polarization time constant indicates a time delay (follower characteristics) in the process of dielectric polarization of a substance after a command input. That is, when the charge on the substrate plate P is to change from +E to −E (generating a change in charge volume of 2E), it is the time duration required for +E to change a certain amount. For example, if the change in the charge volume of the substrate plate P is a first order delay type, the polarization time constant is a time interval for the charge volume in the substrate plate P to change from a charge volume existed in the substrate plate P at the time of voltage switching to the time to reach 63.2% of the final value of charge volume (to attain a steady state value).

Figure 5:
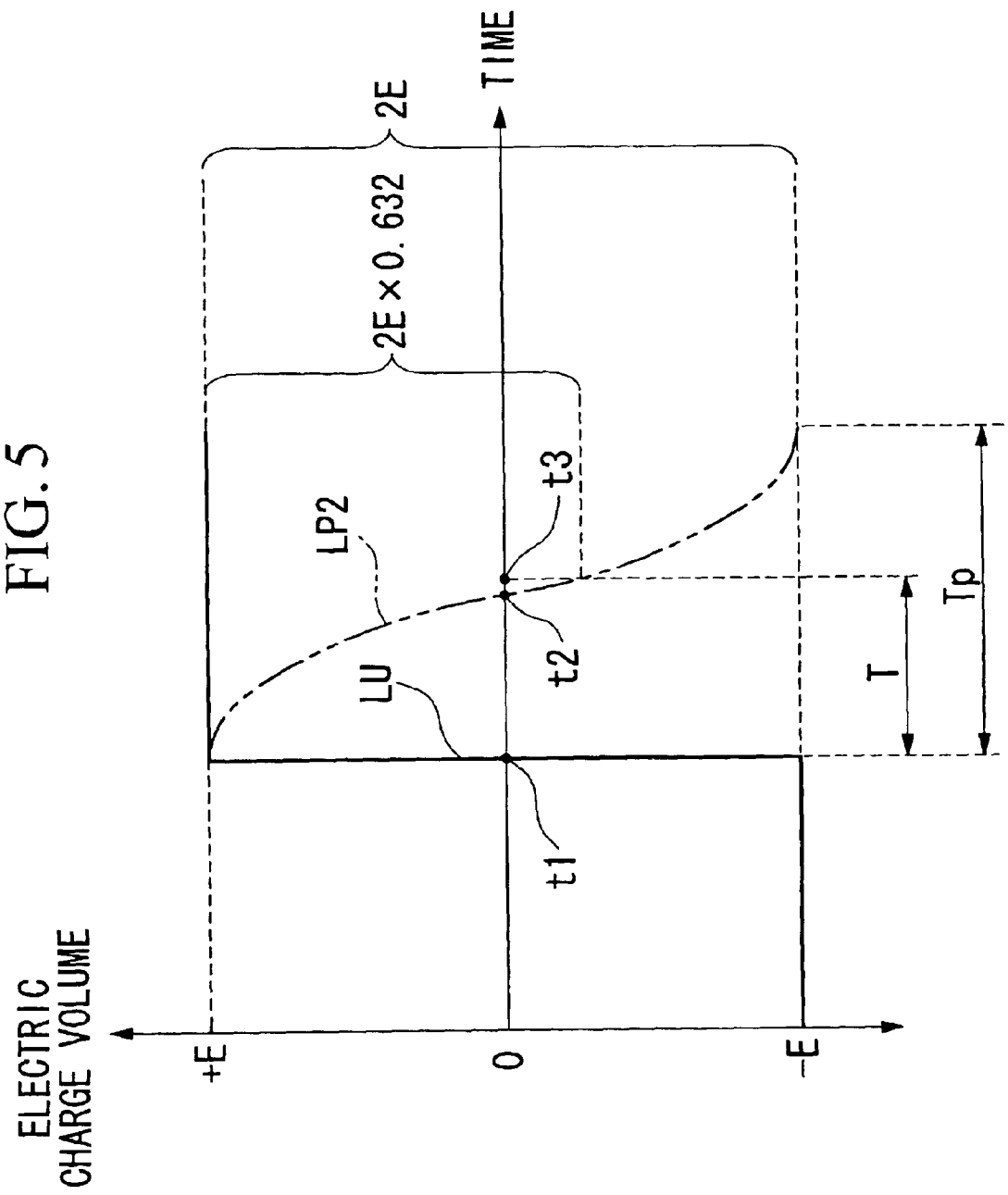
FIG. 5 is a diagram to explain polarization properties of the substrate plate.

The polarization time constant will be explained further with reference to FIG. 5. In FIG. 5, the vertical axis relates to the charge volume and the horizontal axis relates to time, and the line LP2 indicates changes in charge volume at position P2 of the substrate plate P, and the line LU indicates changes in charge volume of electrode U. It is assumed in this case that during the time interval 0~t1, the positively charged position P2 is opposite to the negatively charged electrode U. And, if this state is maintained during the time interval 0~t1, the substrate plate P (position P2) and the electrode U will be bound by the electrostatic forces, and therefore, at time t1, the control apparatus 9 impresses a voltage on the electrode U so as to change the charge code of the electrode U. In practice, the control apparatus 9 switches the voltage to alter the charge volume of the electrode U from −E to +E at time t1. Here, it is assumed that the charge volume of the electrode U is altered in steps to simplify the explanation.

When the charge code of the electrode U changes at time t1, dielectric polarization takes place in the position P2 opposite to this electrode U. That is, as a result of the change to a positive charge in the electrode U, the position P2 opposite to the electrode U begins to charge to the negative polarity which is the opposing charge code. If the change in the charge code in the substrate plate P follows the first order type, the change in the charge volume at position P2 of the substrate plate P follows about a sine curve as shown by line LP2 in FIG. 5. Then, the time interval required for the charge volume of position P2 charged to +E to reach 63.2% of the total change volume (=2E) is the polarization time constant T of the process of changing the charge volume at position P2 from +E to −E due to dielectric polarization. It will be noted that the charge volume at time t3 (that is, time t1 plus an elapsed interval of the polarization time constant) is given by E−2E·0.632. Further, because the change in the charge volume in the substrate plate P follows about a sine curve, polarization time constant T is a certain proportion of the time Tp (interval required to achieve dielectric polarization), which is the duration for the charge volume to change from +E to −E.

During the interval t1~t2, the charge codes of the electrode U and the position P2 are both positive, and therefore, the electrode U and the position P2 are subjected to a repulsive force. Therefore, the substrate plate P levitates against the baseplate 3. However, as time passes, the position P2 changes gradually to a negative charge state due to the action of the positively charged electrode U, if this state is allowed to continue, the electrode U and the position P2 will eventually be bound to each other. Therefore, before the electrode U and the position P2 become bound, the charge code of the electrode U is altered to maintain levitation of the substrate plate P (position P2) with respect to the electrode U. That is, the voltage should be switched before the electrode U and the substrate plate P (position P2) become bound to each other. In doing so, levitation of the substrate plate P with respect to the electrode U can be maintained by setting the timing for switching the voltage to be impressed on the electrode U to be shorter than the polarization time constant. And, by switching the impressed voltage on the electrode U, the electrode U becomes negatively charged and the position P2 which has been gradually charged to a negative polarity due to dielectric polarization is again charged to a positive polarity.

Figure 6:
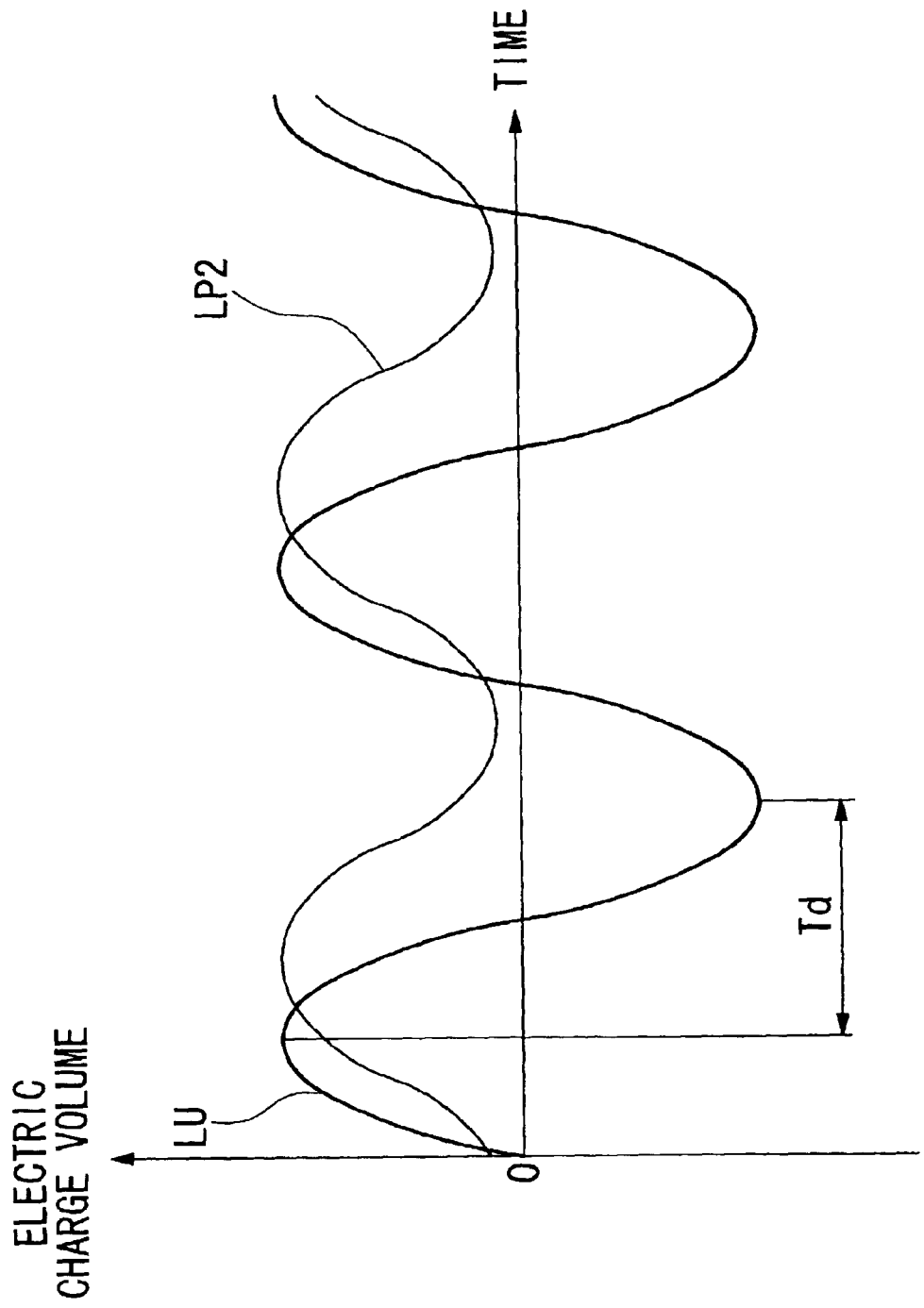
FIG. 6 is a diagram to explain electrical charges accumulated on the electrode and the electrical charges accumulated on the substrate plate.

That is, by setting the switching cycle for changing the charge code for the electrode U to be shorter than the polarization time constant T, the position P2 will maintain non-contact condition to the electrode U by remaining in the positive charge code, as shown by line PT2 in FIG. 6, without changing to the negative charge code. Here, in the diagram shown in FIG. 6, the vertical axis relates to electrical charge and the horizontal axis relates to time and the line LU shows electrical charge on the electrode U. In this case, because the power source impresses ac voltage on the electrode U and the electrode U responds to changes in voltage immediately, electrical charge on the electrode U follows about a sine curve as indicated by the line LU. Also, the change in electrical charge at position P2 lags the change at the electrode U. By setting the cycle Td for switching the charge code for each of the plurality of electrodes 4 (that is, the cycle for switching the charge code for the voltage to be impressed on the electrode U) to be shorter than the polarization time constant T, the substrate plate P is transported in y-direction while maintaining the levitated state against the baseplate 3 provided with the electrodes 4.

In this case, by shortening (that is, by increasing the frequency) the cycle Td (that is, cycle of the ac voltage) for switching the impressed voltage on the electrodes 4, a transport speed of the substrate plate P is increased, conversely, by widening the cycle, the transport speed is decreased.

The substrate plate P transported over the baseplate 3 is detected by the position detection apparatus 6. Detected signals from each detection apparatus 6 are output to the control apparatus 9. For this purpose, the position detection apparatuses 6 are arranged along the transport direction of the substrate plate P at a given spacing, so that the control apparatus 9 is able to compute the speed of the substrate plate P being transported based on the signals from each position detection device 6 and the traveling intervals. The control apparatus 9 is then able to control the transport speed of the substrate plate P.

That is, if it is desired to increase the transport speed of the substrate plate P, the control apparatus 9 shortens the switching cycle Td for switching the impressed voltage applied to the electrodes 4, as shown in FIG. 6. Then, the transport speed of the substrate plate P is increased in response to the changes in the switching cycle Td. On the other hand, if it is desired to lower the transport speed, the control apparatus 9 makes the switching cycle Td wider.

Here, when increasing the switching cycle Td, settings are chosen within a range so that the switching cycle Td does not exceed the polarization time constant T.

Also, the position detection apparatus 6 placed outside the second electrode 5 detects the position of the substrate plate P at right angles (x-direction) to the transport direction (y-direction) of the substrate plate P. That is, in FIG. 2, when the substrate plate P is being transported along the center section of the baseplate 3, the position detection apparatuses 6 disposed on both lateral sides of the second electrode 5 detect the baseplate 3, and the detected signals are sent to the control apparatus 9. In this case, the control apparatus determines that the substrate plate P is being transported correctly in the center section of the baseplate 3. On the other hand, if the substrate plate P strays from the center section of the baseplate 3, for example, either of the position detection apparatuses 6 provided on both lateral sides of the baseplate 3 detects the detected signals while the other position detection apparatus 6 does not detect the baseplate 3. In such a case, the control apparatus 9 determines that the substrate plate P is not being transported correctly on the baseplate 3.

When it is determined that the substrate plate P is not being transported correctly on baseplate 3, the control apparatus 9 controls second electrode 5 so as to transport the substrate plate P in the center section of the baseplate 3. That is, for example in FIG. 2, if the substrate plate P is being displaced in the +x direction during the transport process, impressed voltage on the second electrode 5 will be controlled so as to move the substrate plate P in the −x direction, while if the substrate plate P is being displaced in the −x direction during the transport process, impressed voltage on the second electrode 5 will be controlled so as to move the substrate plate P in the +x direction according to the degree of displacement.

The substrate plate P is thus transported correctly in the center section of the baseplate 3 in a steady manner.

<Step 4>

The substrate plate P transported to the vicinity of the exposure apparatus 100 by the transport apparatus H is loaded onto the substrate holder 132 on the substrate stage 130 by the plate load/unload section R. When the substrate plate P is placed on the substrate holder 132, the control apparatus 9 operates a vacuum chucking source (not shown) to chuck the substrate plate P on the substrate holder 132 by way of the vacuum suction hole provided on the substrate holder 132. The substrate plate P is thus held on the substrate holder 132. Here, the mask M to be used in the exposure process is also transported to the mask stage 111 by the mask loader and retained thereon.

The control apparatus 9 operates the stages 111 and 130 to perform alignment of the mask M and the substrate plate P with respect to the illumination system 150 and the projection optical system 120 using the alignment system (not shown).

<Step 5>

When the alignment of mask M and substrate plate P is finished, the exposure light EL is emitted from the illumination system 150 towards the mask M. The exposure light EL passes through the mask M, by way of the projection optical system 120, and focuses an image of the pattern of mask M in the projection region of the substrate plate P. The image of the pattern formed on the mask M is thus imprinted on the substrate plate P.

As explained above, the substrate plate P that has been electrically charged is levitated against the baseplate 3 of the transport apparatus 2 due to electrostatic forces, by impressing a specific voltage on each of the electrodes 4 so as to charge the electrodes to the same charge code as the charge codes of the substrate plate P. Then, by switching the voltage codes impressed on the plurality of electrodes 4 arranged along the baseplate 3 so as to change the charge codes of each of the electrodes 4, a force in the transport direction (y-direction) is applied for transporting the substrate plate P. Because the substrate plate P is transported without being in contact with the baseplate 3, the transport apparatus H prevents generation of vibration and enables to transport the substrate plate P at high speed. Therefore, not only effective substrate transport operation is realized but also the substrate plate P (devices) can be produced at high productivity by the exposure apparatus 1 having the transport apparatus H.

And, by setting the switching cycle Td for changing the charge code impressed on the electrode 4 to be shorter than the polarization time constant T, the levitated state of the substrate plate P being transported against the baseplate 3 of the transport apparatus main body 2 is maintained in a stable manner. That is, because the substrate plate P is transported while maintaining the non-contact state to the baseplate 3, transport process can be carried out efficiently at high speed while suppressing vibration generation.

In addition, by providing a plurality of second electrodes 5 in a direction (x-direction) at right angles to the direction (y-direction) of the arranged electrodes 4, position control can be exercised in the perpendicular direction to the transport direction of the substrate plate P. Therefore, the substrate plate P can be transported in stable manner. Furthermore, in this embodiment, the second electrodes 5 are disposed on both lateral sides of the electrodes 4, but an arrangement having the electrode 4 only on one side is also effective in controlling the position of the substrate plate P in the x-direction. However, by providing the second electrodes 5 on both lateral sides, more stable position control can be achieved.

Also, by providing the position detection apparatuses 6 and outputting the detected results from the position detection apparatuses 6 to the control apparatus 9, and operating the electrodes 4 and second electrodes 5 according to the detected results, it is possible to transport the substrate plate P at a desired speed while controlling the position of the substrate plate P.

Figure 7:
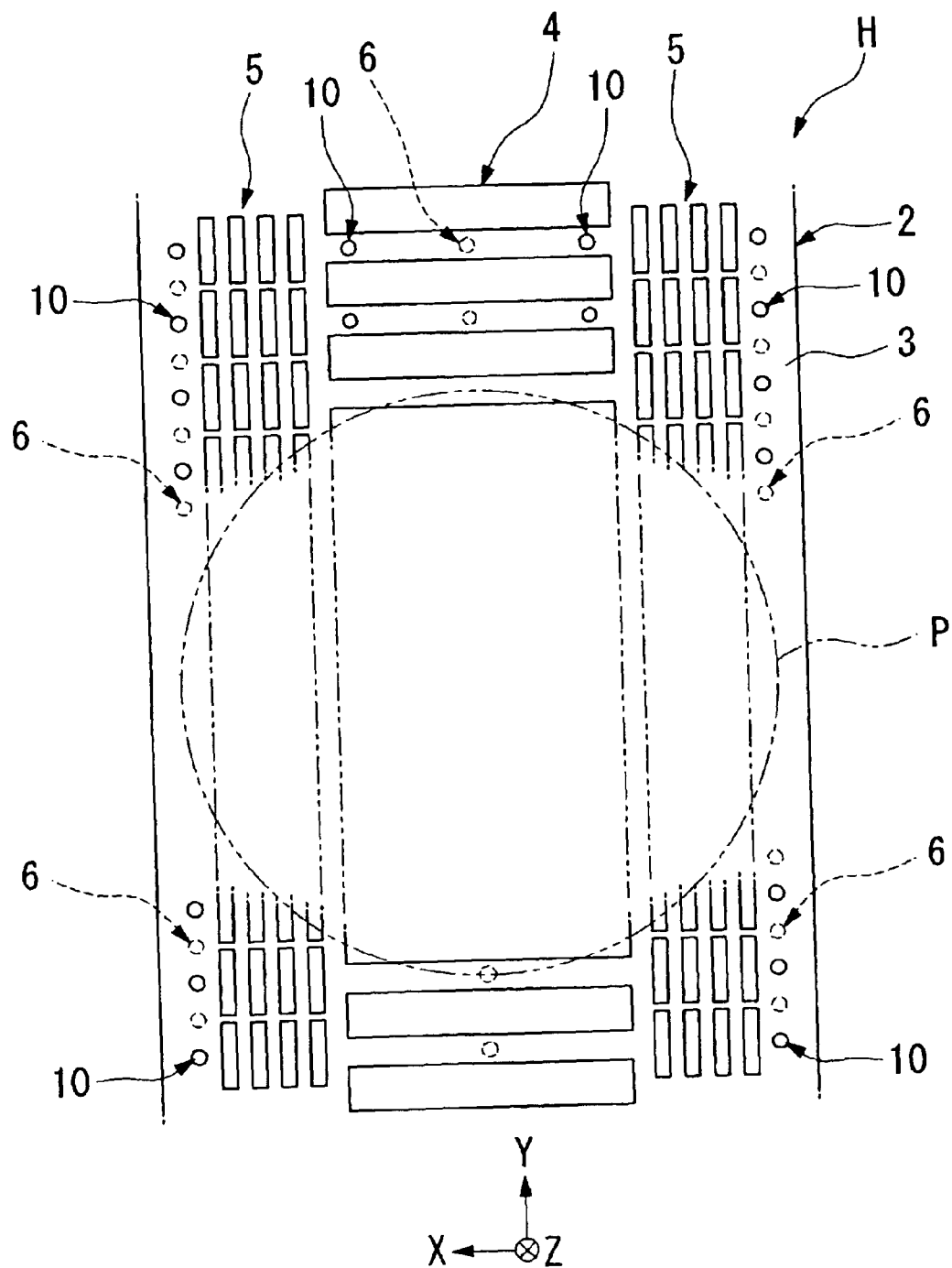
FIG. 7 is a diagram to explain a transport apparatus having a gas supply apparatus.

Furthermore, gas supply apparatuses 10 can be provided in the baseplate 3, as shown in FIG. 7, for supplying a gas to the substrate plate P being transported. The gas supply apparatuses 10 are provided in several locations (four in this embodiment) in the x-direction and at a certain spacing along the y-direction. In this case, the gas supply apparatus 10 supplies an inert gas such as helium gas to the substrate plate P being transported. The volume of gas supplied from each gas supply apparatus 10 is controlled independently by the commands from the control apparatus 9, and by supplying a gas to the substrate plate P being transported, the direction of the substrate plate P levitated against the baseplate 3 can be controlled. That is, the supply volume of gas by each gas supply apparatus 10 is controlled according to the results of detected position of the substrate plate P obtained by the position detection apparatus 6. And, while detecting the position and the direction of the substrate plate P being transported, and according to the detected results, the control apparatus 9 controls at least one of the electrodes 4, second electrodes 5 and gas supply apparatus 10 to enable to transport the substrate plate P in a stable manner on the baseplate 3.

Accordingly, by providing gas supply apparatuses 10 between the substrate plate P and the baseplate 3 to supply a gas, and by supplying a gas between the substrate plate P and the baseplate 3 using the gas supply apparatuses 10, levitation of the substrate plate P against the baseplate 3 can be carried out in a stable manner. Thus, the substrate plate P can be transported at high speed while maintaining non-contact condition to the baseplate 3 to reliably achieve effective transport of the substrate plate P.

Here, it should be noted that the gas supply apparatus 10 is provided on the baseplate 3 in this embodiment, but so long as the structure allows to supply a gas between the substrate plate P and the baseplate 3 to assist levitation of the substrate plate P, it can be constructed by having nozzles on the lateral side of the baseplate 3 for supplying a gas. In this case, the gas supplied from the nozzle can assist levitation of the substrate plate P and control the direction of the substrate plate P.

Figure 8:
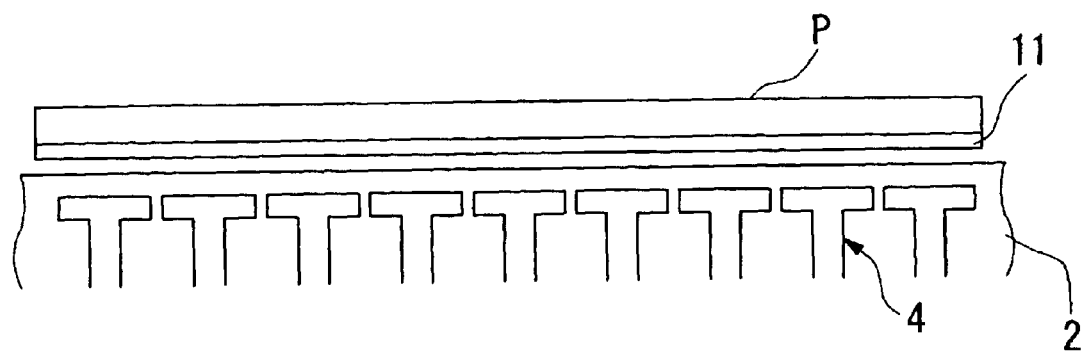
FIG. 8 is a diagram to explain a substrate plate having an insulating layer.

Also, by constructing the baseplate 3 using an insulating member such as polymer resin and providing the baseplate 3 between the substrate plate P and the electrode 4 and the second electrode 5, dielectric polarization of the substrate plate P is carried out in a stable manner. It should also be noted that although the insulating member in this embodiment is constructed of the baseplate 3 provided in the transport apparatus main body 2, it may also be constructed of an insulation layer applied to the transport plane of the transport apparatus main body 2. Further, as shown in FIG. 8, the insulating member may be made of an insulating layer 11 comprised by a resin coating applied on the side of the substrate plate P that is opposite to the transport apparatus H. In this case, the insulating layer (resin layer) 11 may be provided by pre-coating the substrate plate P before it is transported to the exposure apparatus 1.

Also, in this embodiment, the transport apparatus is designed to transport the substrate plate P between the substrate storage section and the exposure apparatus main body, or between the coater/developer and the exposure apparatus main body, but the any desirable transport path may be selected such as between the coater/developer and the substrate storage section, for example.

In this embodiment described above, the substrate holder 132 mounted on the substrate stage 130 uses vacuum chucking of substrate plate P, but as in the transport apparatus H, electrostatic forces may be employed.

In the following, examples of the structure of a substrate holder 132 serving the function of the substrate holder apparatus which employs electrostatic forces will be explained.

Figure 9:
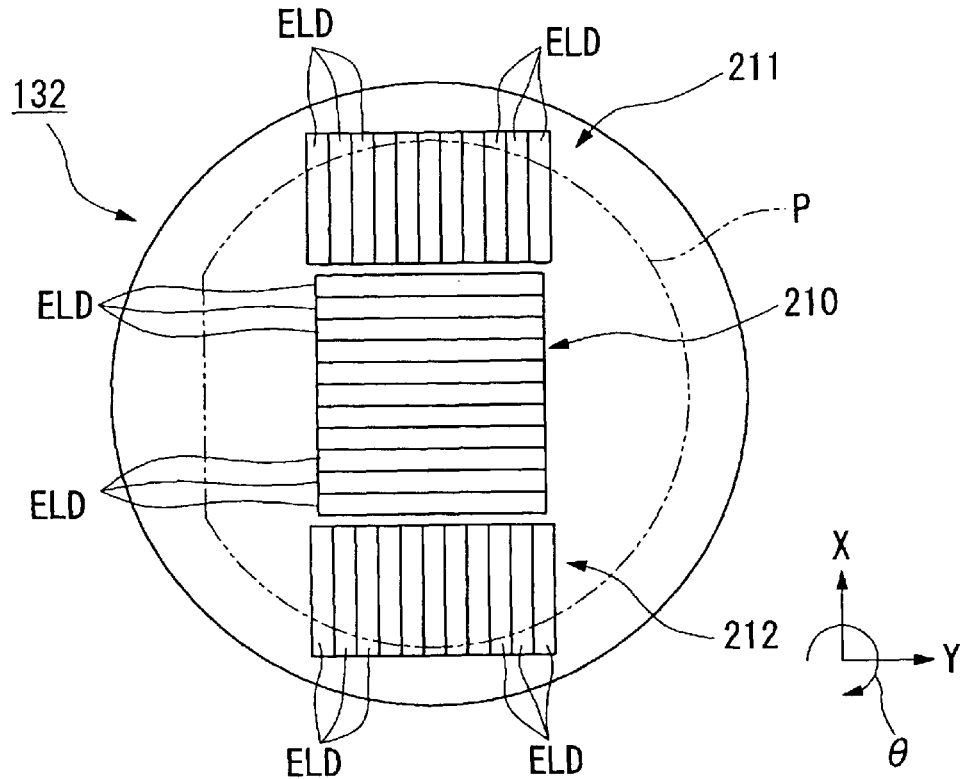
FIG. 9 is a plan view of an embodiment of a positioning apparatus of the present invention and a substrate holding apparatus integrated with the positioning apparatus.
Figure 10:
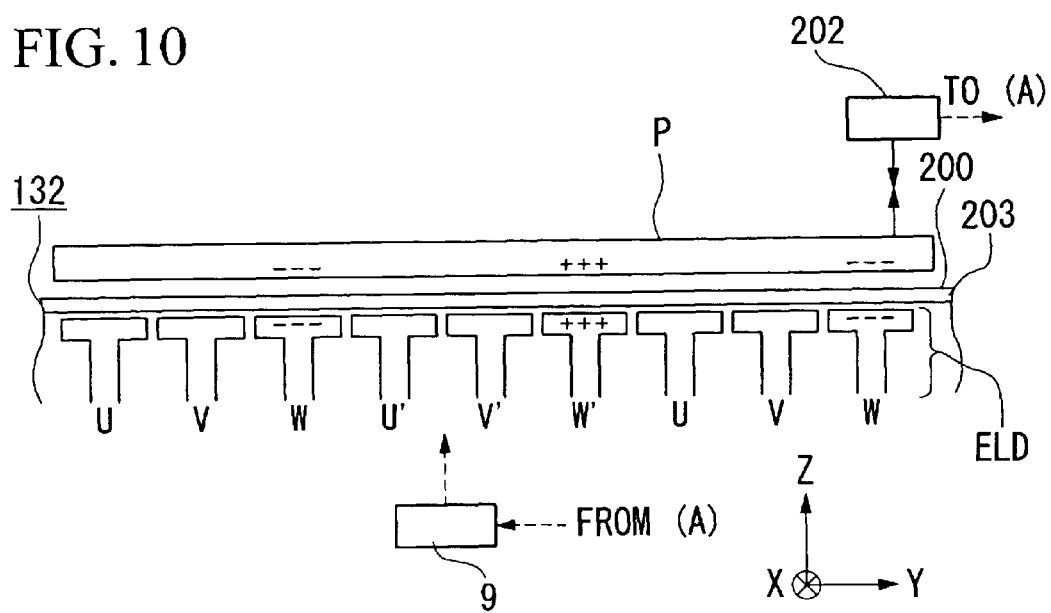
FIG. 10 is an enlarged cross sectional view of an embodiment of a positioning apparatus of the present invention and a substrate holding apparatus integrated with the positioning apparatus.
Figure 11A:
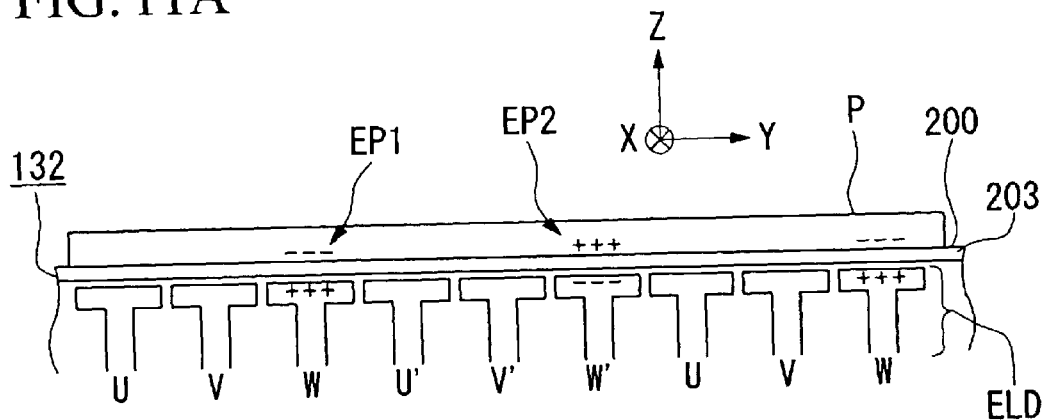
FIG. 11A is an enlarged cross sectional view to explain the positioning operation of the positioning apparatus and the substrate holding apparatus shown in FIG. 9.
Figure 11B:
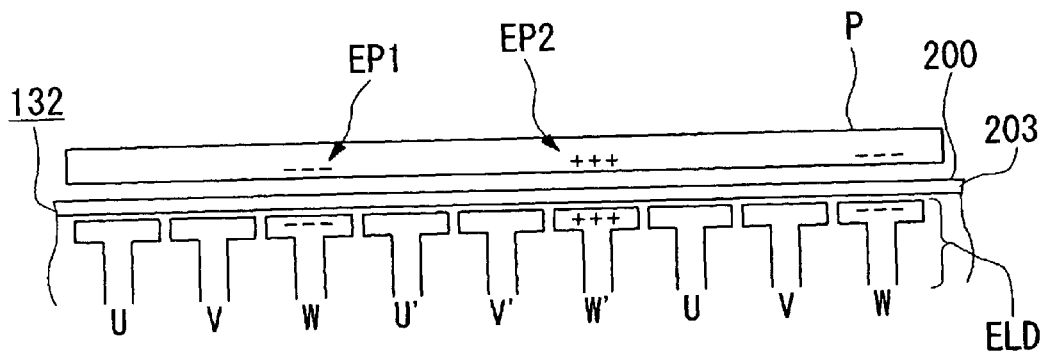
FIG. 11B is an enlarged cross sectional view to explain the positioning operation of the positioning apparatus and the substrate holding apparatus shown in FIG. 9.
Figure 11C:
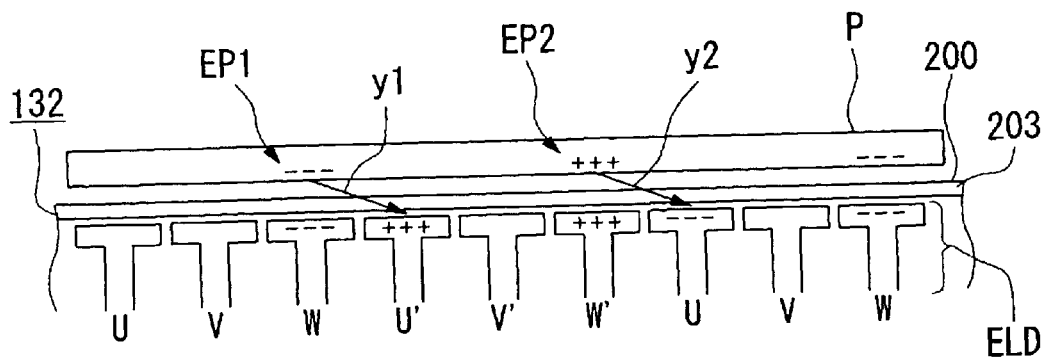
FIG. 11C is an enlarged cross sectional view to explain the positioning operation of the positioning apparatus and the substrate holding apparatus shown in FIG. 9.

FIGS. 9 and 10 show schematic diagrams of the substrate holder 132, and FIGS. 11A to 11C show enlarged views of some essential parts of the substrate holder 132.

The substrate holder 132 shown in FIGS. 9 and 10 is a dual function apparatus, having a function of substrate positioning apparatus for positioning the substrate plate P as well as a function of substrate holding apparatus for holding the substrate plate P, and is comprised mainly by a holding surface 200 for holding the substrate plate P; a plurality of electrodes ELD disposed below (−z direction) the holding surface 200; a power source (including amplifiers and the like); a position detection apparatus 202 for detecting the position of the substrate plate P on the holding surface 200. Also, a film covering (insulation layer) 203 is formed on the holding surface 200 comprised by a resin, for example.

The plurality of electrodes ELD are arranged along the holding surface 200. In the example given in the diagram, each of the electrodes ELD is formed in a rectangular shape in the plan view, and is disposed adjacent to each other at a given spacing in a direction to intersect the longitudinal direction of each electrode ELD at right angles. The sharp corners of the electrodes ELD may be rounded to prevent concentration of electrical charges.

The electrodes ELD are divided into a first electrode section 210 located in the center of the substrate holder 132, a second electrode section 211 and a third electrode section 212 located on both lateral sides of the first electrode section 210 in the x-direction. That is, in the first electrode section 210, a plurality of electrodes ELD are arranged in the x-direction at the given spacing, and in the second and third electrode sections 211, 212, a plurality of electrodes ELD are arranged in the y-direction at the given spacing. Here, the longitudinal length of the electrodes ELD and regional area of each electrodes section 210, 211, 212 are determined according to the size of the substrate plate P as the object to be held.

The power source is constructed so as to supply a specific independent voltage to each electrode ELD. Also, the charge code (positive or negative) to be impressed on the electrode ELD can be switched under the control of the controller 9. Specifically, the power source impresses an ac-like voltage to each electrode ELD. Here, the electrode ELD is a multiphase type (in this example, three phase) designated by U, V, W, U', V', W' to provide a set of three electrodes of different types along the spaced direction.

The position detection apparatus 202 has a CCD or a laser displacement sensor and the like, and it is constructed such that, by detecting the periphery of the substrate plate P, for example, the position of the substrate plate P in the xy-direction is detected or the position of the substrate plate P in the rotation direction is detected. Further, the position detection apparatus 202 is constructed such that, using the reflected light from an injection light type apparatus, the position in the z-direction or its inclination is detected. The detected signals from the position detection apparatus 202 are input into the control apparatus 9. The control apparatus 9 controls the voltage to be impressed on the electrodes ELD according to the detected signals sent from the position detection apparatus 202.

Here, the substrate holder 132 is provided with an anti-vibration apparatus (not shown) to prevent transmission of vibrations to the substrate plate P and the holding surface 200 is protected from vibrations caused by other apparatuses.

Next, the operation of positioning process to determine the position of the substrate plate P on the holding surface 200 of the substrate holder 132 having the structure described above will be explained.

First, as shown in FIG. 11A, a specific voltage is impressed on the electrodes ELD so as to charge the substrate plate P placed in contact with the holding surface 200 (first step).

That is, the control apparatus 9 commands the power source to impress specific voltages on the electrode W, W' of the plurality of electrodes ELD. The electrodes ELD impressed with the voltages are charged to a positive or a negative charge state depending on the voltages applied. In this case, the electrode W is positively charged and the electrode W' is negatively charged.

When the electrodes W, W' are charged, dielectric polarization is induced in the substrate plate P and the regions of the substrate plate P near the electrodes W, W' are charged to a positive or a negative charge state. In this case, a location EP1 near the electrode W is charged to a negative charge in opposition to the polarity of the electrode W, and a location EP2 near the electrode W' is charged to a positive charge state in opposition to the polarity of the electrode W'.

Here, the time interval required to attain dielectric polarization in the substrate plate P is determined by the physical properties of the substrate plate P. Also, the data regarding the time required for dielectric polarization of the substrate plate P are obtained by experiments and the like, and are stored in the control apparatus 9 with it properties data.

Next, as shown in FIG. 11B, when each location in the substrate plate P is charged to a specific charge state (charge volume), those electrodes of the plurality of electrodes ELD that were charged in step 1 are charged to a respective opposite polarity (step 2).

That is, the control apparatus 9 impresses a voltage to each electrode W and W' such that the respective charge codes are different than those applied in step 1. By so doing, the electrode W is charged to a negative polarity and the electrode W' is charged to a positive polarity. In other words, the electrodes W W' are charged so that the respective charge codes are the same as those of the locations EP1, EP2 in the substrate plate P.

Accordingly, the location EP1 of the substrate plate P and the electrode W both are charged to one charge code of the negative polarity, and the location EP2 of the substrate plate P and the electrode W' both are charged to other charge code of the positive polarity. When electrical charges of the same charge code are generated, repulsive forces due to electrostatic forces are generated between the locations in the substrate plate P and the electrodes ELD, and the substrate plate P is levitated against the holding surface 200 due to the electrostatic forces Here, the values of the voltage to be impressed on each electrode ELD in the steps 1 and 2 are pre-determined by the physical properties and the size (weight) of the substrate plate P, and values necessary to levitate the substrate plate P are selected. That is, the electrostatic forces necessary to levitate the substrate plate P is determined by the size and other factors of the substrate plate P, and the charge state (charge volume) is determined according to the chosen electrostatic forces. And, the voltage to be impressed (voltage value) to obtain the necessary charge volume on each electrode ELD is determined. The data regarding such voltages are pre-determined by experimentation and the like, and are stored in the control apparatus 9.

Next, as shown in FIG. 11C, the voltages applied to the plurality of electrodes ELD are switched so as to move the levitated substrate plate P to a specific position (step 3).

That is, in order to move the substrate plate P, the control apparatus 9 applies voltages to the electrodes U', U in the downstream side of the electrodes W, W' that were impressed with voltages in step 2, which is the desired direction of moving the substrate plate P (in this case, +y direction). The voltages impressed on the electrodes U, U' are opposite in polarities to those of the adjacent upstream electrodes W, W', or in other words, charge codes of the impressed voltages are opposite to those of the adjacent locations EP1, EP2 in the substrate plate P. Here, the absolute values of the voltages impressed on the electrodes U, U' are substantially the same as those applied to the electrodes W, W' in step 2.

Accordingly, forces of attraction due to static electricity are generated between the location EP1 in the substrate plate P and the electrode U', and as shown in FIG. 11C, the location EP1 is subjected to a force in the direction of the arrow y1. Similarly, forces of attraction due to static electricity are generated between the location EP2 in the substrate plate P and the electrode U in the direction of the arrow y2. In this manner, forces of attraction due to static electricity are generated in each charging location in the substrate plate P, and the substrate plate P is moved with respect to the holding surface 200 in the desired direction by the action of the electrostatic forces.

When the substrate plate P is moved by the electrostatic forces and the negatively charged location EP1 comes opposite to the positively charged electrode, the location EP1 is subjected to a force to attract it towards the electrode U' due to electrostatic forces. Similarly, when the positively charged location EP2 comes opposite to the negatively charged electrode U, the location EP2 is subjected to a force to attract it towards the electrode U due to electrostatic forces. If this state is maintained, the substrate plate P comes into contact with the holding surface 200 due to the force of attraction.

Therefore, within a specific time interval of the location EP1 coming opposite to the electrode U' (or the location EP2 coming opposite to the electrode U), the voltage impressed on electrode U' is switched so that the charge code will be different than the charge code that existed there, thereby making it possible to maintain the state of levitation of the substrate plate P by the action of the repulsive electrostatic forces.

When performing this operation, the timing for switching the voltage is determined by the polarization time constant of the substrate plate P. The polarization time constant indicates, as described earlier, a time delay (follower characteristics) for the process of dielectric polarization in a substance after a command input. For example, if the change in the charge volume of the substrate plate P follows a first order delay type, the polarization time constant is a time interval for the charge volume in the substrate plate P at the time of voltage switching to reach 63.2% of the final value of charge volume (to attain a steady state value).

This will be explained with reference to FIG. 5. In this case, the line LP2 relates to changes in the charge volume at the location EP2 in the substrate plate P, and the line LU shows changes in the charge volume of the electrode U. Also, in the time interval 0~t1, it is assumed that the positively charged location EP2 is opposite to the negatively charged electrode U with a given separation.

If the state existing during 0~t1 is maintained, the substrate plate P (location EP2) and the electrode U will become bound to each other, therefore, at time t1, the control apparatus 9 switches the voltage volume of electrode U from −E to +E. Here, it is again assumed, to simplify explanation, that the charge volume on the electrode U will be altered in steps.

Due to the change in the charge code of the electrode U at time t1, dielectric polarization takes place in location EP2 that opposes the electrode U. That is, the location EP2 opposite to the electrode U will charge, as the electrode U is being charged to a positive state, so as to attain an opposite polarity. As described earlier, when this change is a first order delay type, as shown by line LP2 in FIG. 5, the charge volume at the location EP2 of the substrate plate P will follow about a sine curve, for example. In the process of changing the charge volume from +E to −E at the location EP2 of the substrate plate P due to dielectric polarization, the polarization time constant T is a time T required for the charge volume of the location EP2 at +E to change to a charge volume that is 63.2% of the total amount of change (=2E).

In the following time interval t1~t2, the charge codes for both electrode U and location EP2 are positive so that the electrode U and location EP2 will repel each other. Therefore, the substrate plate P is maintained in the levitated state with respect to the holding surface 200. However, as time passes, due to the action of the positively charged electrode U, the location EP2 gradually changes to a negative charge state. If the location EP2 becomes negatively charged, the electrode U and the location EP2 of the substrate plate P will become bound to each other, and therefore, the control apparatus 9 switches the charge code of the electrode U before the location EP2 changes to a negative polarity due to the change in the charge code of the electrode U.

That is, if it supposed that the location EP2 of the substrate plate P is maintained above the electrode U, by switching the charge code of the electrode U in a shorter cycle than the polarization time constant T that indicates the delay in dielectric polarization to follow the change in the electrode U, as illustrated in LP2 in FIG. 5, it is possible to maintain the positive charge code at the location EP2 to continue to apply the action of repulsive forces between the location EP2 and the electrode U. Also, the power source impresses an ac voltage on the electrode U. Because the electrode U responds immediately to changes in the voltage, the charge on the electrode U follows about a sine curve as illustrated earlier by the line LU in FIG. 6.

Returning to FIGS. 11A to 11C, as described earlier, in step 3 shown in FIG. 11C, by switching the voltages impressed on the plurality of electrodes ELD, the attractive forces due to static electricity are operating so as to move the levitated substrate plate P to a specific position.

Therefore, as described earlier, by setting the switching cycle Td for switching the charge codes of the plurality of electrodes ELD to be less than the polarization time constant T of the substrate plate P, it is possible to maintain the levitated state of the substrate plate P by utilizing the repulsive forces due to static electricity between the specific electrodes ELD and the charged locations in the substrate plate P, and to move the substrate plate P in the desired direction utilizing the attractive forces due to static electricity between the downstream electrodes ELD and the charged locations in the substrate plate P. Also, by controlling the switching interval of impressing the voltage on the electrodes ELD, the amount of movement of the substrate plate P can be controlled.

FIGS. 12A to 12C show the manner of moving the substrate plate P on the holding surface 200.

That is, as shown in FIG. 12A, by switching the voltage to be impressed on the first electrode section 210, attractive forces (driving force) due to static electricity are operated on the substrate plate P in the +x-direction (or −x direction) along which the electrodes ELD are spaced to enable to position the substrate plate P in the x-direction. Also, as shown in FIG. 12B, by switching the voltages to be impressed on the second electrode section 211 and the third electrode section 212 synchronously, positioning of the substrate plate P in the y-direction is possible. Further, as shown in FIG. 12C, by switching the voltage so that the attractive forces are operating in the opposing directions between the second electrode section 211 and the third electrode section 212 (for example, attracting the substrate plate P in the +y direction using the second electrode section 211, and attracting the substrate plate P in the opposing −y direction using the third electrode section 212), the substrate plate P can be subjected to a rotational force (θ-direction) to perform positioning in the rotational position of the substrate plate P. By taking these steps, the substrate plate P can be positioned in the x-, y- and rotation-directions.

Further, because the electrostatic forces between the charged locations of the substrate plate P and the electrodes ELD vary according the magnitude of the voltage, by changing the voltage impressed on the electrodes ELD to vary the repulsive force between the substrate plate P and the electrodes ELD, it is possible to move the substrate plate P in the z-direction. Also, by changing the voltage impressed on the electrodes ELD in each special regions within the holding surface 200 to change the repulsive forces for each region above the holding surface 200, it is possible to alter the inclinatory direction of the substrate plate P.

Also, the control apparatus 9 performs positioning operations described above by controlling the voltage impressed on each of the electrodes ELD according to the detected signals (position data) supplied from the position detection apparatus 202.

Then, the substrate plate P moved to a specific position is allowed to land on the holding surface 200 by the action of the electrostatic forces, and by activating the attractive force due to static electricity between the substrate plate P and the holding surface 200, the substrate plate P is held in a specific position on the holding surface 200 (step 4).

That is, the control apparatus 9 performs landing operation of the substrate plate P by changing the switching cycle for the voltage to be impressed on the electrodes ELD and controlling the values of the voltage to decrease the repulsive force between the substrate plate P and the holding surface 200 to allow the substrate plate P to land on the holding surface 200 due to its own weight. Subsequently, the control apparatus 9 impresses voltages on the plurality of electrodes ELD so as to generate opposing charge codes in various charging locations of the substrate plate P to effect attractive forces between the substrate plate P and the holding surface 200 due to static electricity.

By following a series of such operations, the substrate holder 132 is able, using the electrostatic forces, to position the substrate plate P in a specific position, while levitating the substrate plate P against the holding surface 200, and to hold the substrate plate P.

At this time, the actions of the exposure apparatus main body 100 provided with the substrate holder 132 utilizing the electrostatic forces as described will be explained briefly with reference to FIG. 4.

First, the substrate plate P coated with a photo-resist material is transported by the substrate transport apparatus to the vicinity of the exposure apparatus main body 100, and is loaded onto the substrate holder 132 of the substrate stage 130.

The substrate holder 132 positions (pre-aligns) the substrate plate P using electrostatic forces according to the series of operations described above, and holds the substrate plate P on the holding surface 200 by electrostatic chucking (refer to FIG. 10).

The control apparatus 9 operates each stage 111 and 130 to perform alignment of the mask M and the substrate plate P, using the alignment system (not shown), with respect to the illumination system 150 and the projection optical system 120.

After finishing alignment of the mask M and the substrate plate P, the exposure light EL is emitted from the illumination system 150 towards the mask M. The exposure light EL projects through the mask M, and the projection optical system 120, to focus an image of the pattern of mask M onto the projection region on the substrate plate P. The image of the pattern formed on the mask M is thus imprinted on the substrate plate P. Also, for the purpose of improving the production capability, this exposure apparatus performs other preparatory steps such as positioning (pre-alignment) and holding a next substrate plate P on another substrate holder 132 provided for the exposure apparatus main body 100.

As explained above, according to the present substrate holder 132, by statically charging the substrate plate P and impressing a specific voltage on a plurality of electrodes ELD, levitates substrate plate P above the holding surface 200 by utilizing the electrostatic forces. Then, by switching the voltages to be impressed on a plurality of electrodes ELD arranged along the holding surface 200, the substrate plate P can be moved to a specific position while being levitated against the holding surface 200. Therefore, it is possible to position the substrate plate P on the holding surface 200 with little need for mechanical devices. It is therefore possible to suppress generation of vibration that accompany positioning operations.

Also, by setting the voltage switching cycle Td for switching the charge codes of the voltage to be impressed on the electrodes ELD to be shorter than the polarization time constant T, it is possible to maintain the levitated state of the substrate plate P in a stable manner. Further, because the pre-aligned substrate plate P is held on the holding surface 200 by the electrostatic chucking, the substrate plate P can be held in position reliably.

Also, the exposure apparatus provided with the substrate holder 132 enables to suppress lowering of exposure precision caused by vibration even when exposing one substrate plate P concurrently with positioning (pre-alignment) another substrate plate P, because of less vibration generated by the technique of static charge positioning.

Also, because the substrate holder 132 fulfills a function of position the substrate plate, in addition to the original function of serving as the substrate holding apparatus, it aids in designing a compact apparatus. Further, the holding surface 200 of the substrate holder 132 for performing positioning of substrate is protected from vibrations from other apparatuses, vibrations will be less likely to be transmitted to other apparatuses.

Here, it should be noted that the electrodes ELD are divided into a plurality of electrode sections 210, 211, 212. Accordingly, it is possible to perform positioning movements in three directions within the plane of the holding surface 200. Also, by changing the voltage impressed on the plurality of electrodes ELD in individual regions within the plane of the holding surface 200, it is possible to carry out correction of height and inclinatory directions. Also, distribution of the electrodes ELD, the size and number of the electrode sections comprised by electrodes as well as the distribution of assemblies of electrode are flexible.

Figure 13:
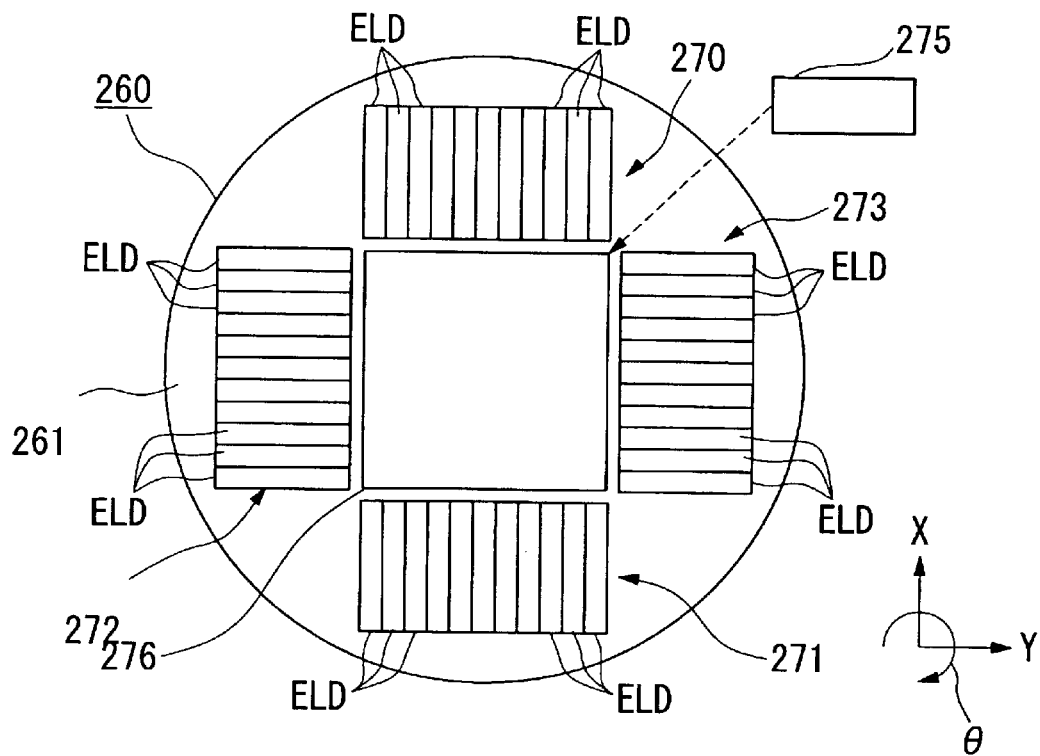
FIG. 13 is a plan view of another embodiment of the positioning apparatus and the substrate holding apparatus.
Figure 14:
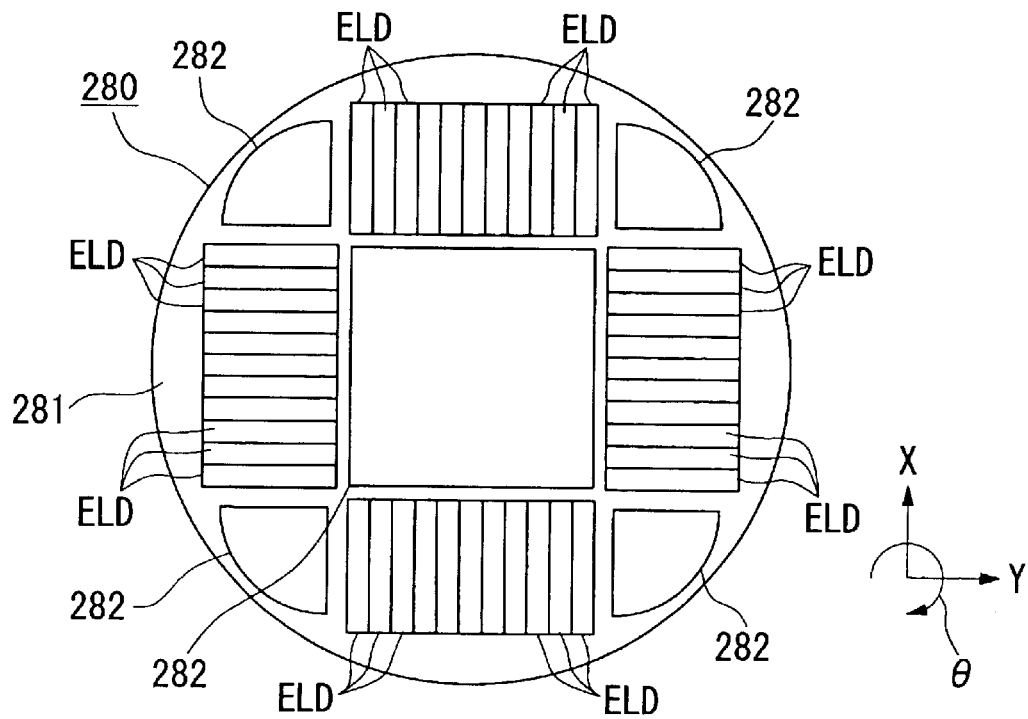
FIG. 14 is a plan view of another embodiment of the positioning apparatus and the substrate holding apparatus.

Next, FIGS. 13 and 14 show another example of construction of the substrate holder based on the electrostatic chucking.

The substrate holder 260 shown in FIG. 13 is comprised by a first electrode section 270 and a second electrode section 271, each having a plurality of electrodes that surround the center region on each side in the x-direction and are arranged in the y-direction; and a third electrode section 272 and a fourth electrode section 273 having a plurality of electrodes that surround the center region on each side in the y-direction and are arranged in the x-direction, to provide a total of four electrode sections. The substrate holder 260 is able, as in the preceding embodiment, to position the substrate plate P in the x-, y- and rotation-directions (θ-direction) within the plane of the holding surface 261, using the four electrode sections 270–273. Also, in this substrate holder 260, because two electrode sections are distributed in x- and y-direction separately, it enables the substrate plate P to be moved readily in the rotation direction, and also, it enables precise adjustments of the position in the height direction as well as the inclinatory direction of the substrate plate P.

Also, in addition to the constructions described above, it is permissible to provide a gas supply apparatus 275 for supplying a gas between the holding surface 261 and the substrate plate P. The gas supply apparatus 275 is constructed such that a gas such as air or helium can be ejected from a numerous gas discharge openings provided in the central gas discharge region 276 surrounded by the electrode sections 270, 271, 272, 273. The gas flow rate is controlled by the control apparatus 9 (refer to FIG. 10) according to the position data supplied from the position detection apparatus 202 (refer to FIG. 10). By supplying the gas from the gas supply apparatus 275 to the bottom surface of the substrate plate P, it is possible to levitate the substrate plate P more stably by utilizing the gas pressure in addition to the electrostatic chucking described above. Further, in this case, the load on the control of voltage for levitating the substrate plate P is reduced, and it enables to carry out non-contact positioning of the substrate plate P more reliably. Here, it is preferable that positioning of the substrate plate P in the height and inclinatory directions be carried out using static charge forces.

The substrate holder 280 shown in FIG. 14 is provided with, in addition to the structures provided for the substrate holder 260 shown in FIG. 13, gas discharge regions 282 having gas discharge openings in several locations near the periphery of the holding surface 281. In this substrate holder 280, because gas discharge regions are provided near the periphery, position adjustments in the height and inclinatory directions of the substrate plate P can be carried out using the gas pressure. Accordingly, the load for controlling the static electricity is further reduced.

That is, as shown in FIGS. 13 and 14, by supplying the gas for levitating the substrate plate P, positioning operation can be carried out efficiently while maintaining non-contact state of the substrate plate P in a stable manner.

Also, in each of the foregoing embodiment, because film covering (insulation layer) comprised by an insulation body 203 such as polymer resin is provided, the process of dielectric polarization can be carried out in a stable manner. However, the insulation body is not limited to the holding surface side, and it may, for example, be provided on the substrate plate P side. That is, as shown in FIG. 8, it is possible to construct the insulation layer 11 comprised by resins and the like on the surface of the substrate plate P opposite to the holding surface. In this case, the insulation layer (resin layer) 11 may be provided by pre-coating on the substrate plate P before it is transported to the exposure apparatus.

It should be noted that in the transport apparatus H shown in FIG. 1 utilizes repulsive force of static electricity to levitate the substrate plate above a transport plane. In contrast, a Japanese Patent Application, First Publication, Hei 8-256487, recites a technique for levitating a transport object using attractive force of static electricity. In other words, this technique relies on suspending a transport object by means of attractive force of static electricity.

Figure 15:
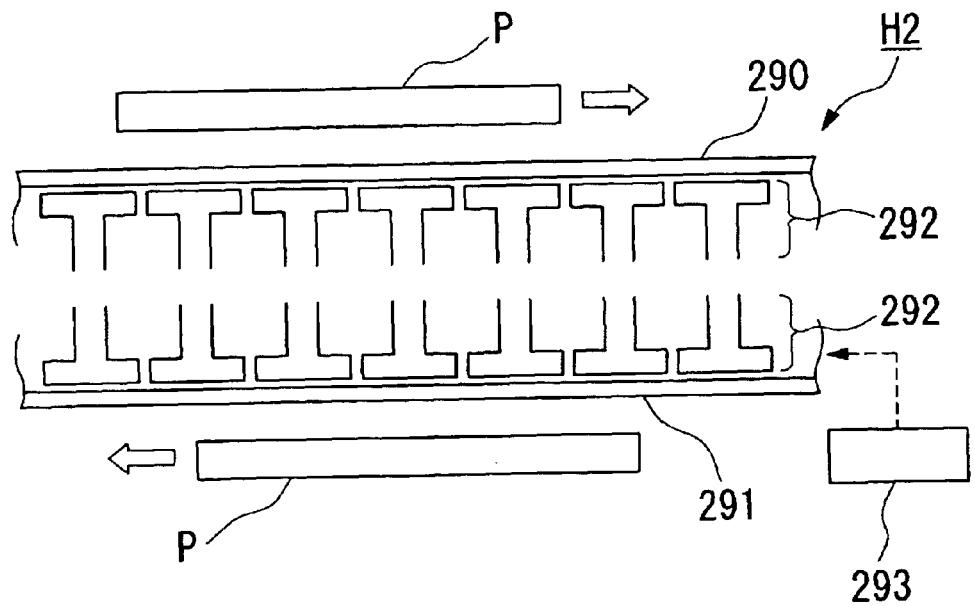
FIG. 15 is a diagram to explain another embodiment of the transport apparatus.

Therefore, it is permissible to construct a transport apparatus so as to combine the function of levitating the substrate plate by means of repulsive force of static electricity and the function of levitating the substrate plate by means of attractive force of static electricity. An example of such a construction is shown in FIG. 15. The transport apparatus H is comprised by: a plurality of electrodes 292 arranged on an upper surface 290 and a lower surface 291 respectively; and a control apparatus 293 for controlling the voltage impressed on each electrode 292; so that not only the upper surface 290 is used to lift the substrate plate P by utilizing the repulsive force of static electricity, but also the lower surface 291 is used to suspend the substrate plate P by utilizing the attractive force of static electricity, so that the substrate plate P is transported in the non-contact state by the effects exerted by the upper surface 290 and the lower surface 291. Here, the transport principle based on utilizing the electrostatic repulsive force of the upper surface is to be based on the arrangement shown in FIGS. 3A to 3C, and the transport principle based on utilizing the electrostatic attractive force of the lower surface is to be based on the arrangement shown in the above cited patent application (Japanese Patent Application, First Publication, Hei 8-256487).

Figure 16:
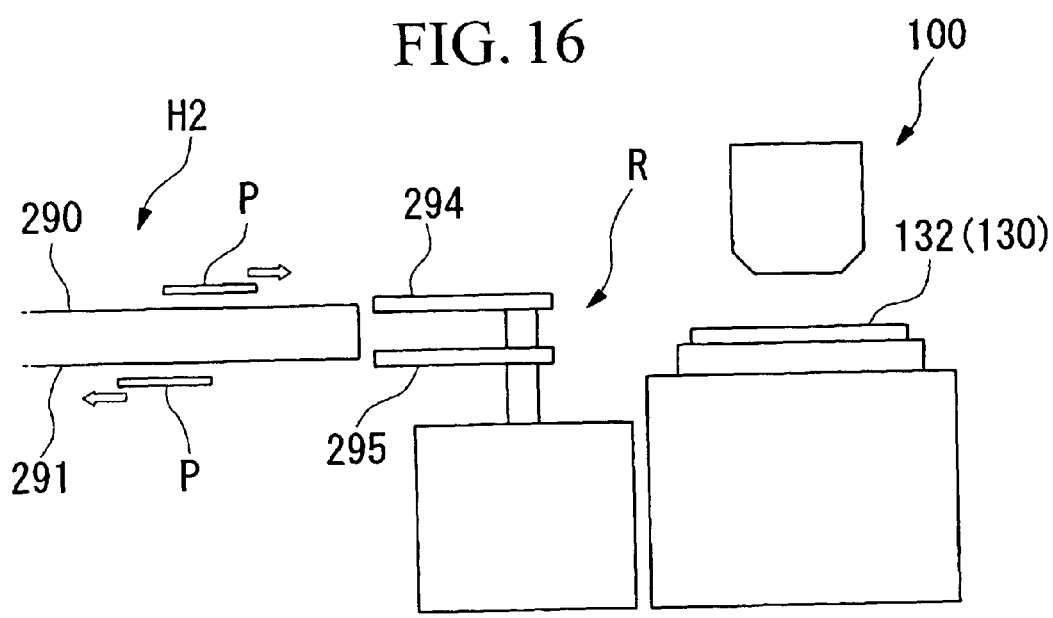
FIG. 16 is a schematic structural diagram of the exposure apparatus having the transport apparatus shown in FIG. 15.

Also, the transport apparatus H uses the control apparatus 293 to control the voltage impressed on each electrode 292 so that the movement direction of the substrate plate P with respect to the upper surface 290 opposes the movement direction of the substrate plate P with respect to the lower surface 291. By so doing, for example, the substrate plate P that has been moved in a certain direction by the upper surface 290 can be returned to the original position by reversing the direction of movement using the lower surface 291. FIG. 16 shows an example of replacing the transport apparatus H shown in FIG. 1 with the transport apparatus H2 to the exposure apparatus.

In FIG. 16, the substrate plate P is transported without contacting the transport plane by the upper surface 290 of the transport apparatus H2 towards the exposure apparatus main body 100, and is loaded onto the substrate holder 132 of the substrate stage 130 by the upper arm 294 of the load/unload section R. The substrate plate P, after being imprinted with the pattern by the exposure apparatus main body 100, is unloaded by the lower arm 295 of the load/unload section R, and is shifted to the lower surface 291 of the transport apparatus H2. Then, the substrate plate P is suspended by the attractive force of static electricity without contacting the lower surface 291 of the transport apparatus H2 and is transported in the reverse direction to the direction of transport of the upper surface 290 towards a next processing station. Here, by providing a groove or a cutout at the end section of the upper surface 290 of transport apparatus H2 for entry of the upper arm 294 of the load/unload section R, the substrate plate P levitated by the repulsive force of static electricity can be handed reliably to the upper arm 294. The arms 294, 295 of the load/unload section R may be constructed of a vacuum chucking type to hold the substrate plate P, or the electrostatic chucking type (substrate holder 132) shown in FIGS. 9 and 10. By installing the load/unload section R having the electrostatic chucking type arm in the exposure apparatus main body 100, it is possible to transport the substrate plate P without contacting the transport plane, in every section of the exposure apparatus from the transport apparatus H2 to the exposure apparatus main body 100.

Accordingly, in the transport apparatus H2 shown in FIGS. 15 and 16, the substrate plate P is levitated by the repulsive force of static electricity produced by the upper surface 290, and the substrate plate P is suspended by the attractive force of static electricity produced by the lower surface 291, and enable to transport the substrate plate P in opposing directions, between the upper and lower surfaces 290, 291 without contacting any transport planes. Therefore, the transport space can easily be made compact.

It should be noted that the shape and combination of various component parts and procedures shown in the preceding embodiments represent examples, may be modified according to design needs without departing from the essence of the present invention. The present invention includes the following modifications, for example.

The transport apparatus and substrate holder (positioning apparatus, substrate holding apparatus) based on electrostatic forces described above are preferably used in vacuum environments. In effect, discharging does not occur readily under vacuum conditions (or comparable conditions) even when the potential difference between the substrate plate P and the electrodes ELD is high. For this reason, it becomes possible to impress higher voltages on the electrode ELD. By impressing a higher voltage, the substrate plate P can be levitated, transported and positioned even more stably and reliably. However, because it is difficult to use gaseous substances in a vacuum, other means to aid the levitation of the substrate plate P may be used by providing an apparatus for generating electromagnetic or magnetic force, for example, to utilize eddy current effects.

Also, the substrate plate P in the present invention is not limited to semiconductor wafers for semiconductor devices, and other objects such as glass plates for display devices and ceramic wafers for thin film magnetic heads may also be applied.

Also, the exposure apparatus main body 100 can be adopted not only to the steppers in which the pattern on the mask M is exposed on the substrate plate P while the mask M and the substrate plate P are held stationary so that the substrate plate P is successively moved according to the step-and-repeat process of exposure, but also to the scanning steppers in which the mask M and the substrate plate P are synchronously moved to expose the pattern of the mask M onto the substrate plate P.

Also, the present invention is applicable to a wide variety of types of exposure apparatus in addition to semiconductor device manufacturing, such as exposure apparatus for liquid crystal display device manufacturing, or for manufacturing thin film magnetic heads, imaging devices (CCD), or mask making.

The light source 153 for the illumination system 150 may be served by the luminous line emitted from the mercury lamp (g-line emitting at 436 nm), h-line emitting at 404.7 nm, i-line at 365 nm, KrF excimer laser emitting at 248 nm, ArF excimer laser emitting at 193 nm, $F_2$ laser emitting at 157 nm, and X-ray or electron beam emitter may also be used. For example, when using an electron beam device, electron gun may include thermoelectric type such as lanthanum hexaboride ($LaB_6$) and tantalum (Ta). Also, high frequency waves generated from devices such as YAG laser or semiconductor lasers may be used. Further, when using electron beam exposure, pattern may be formed using a mask, or the substrate may be exposed directly without using a mask.

Also, the projection optical system 120 may include as the light medium, materials such as quartz and fluorite when using excimer lasers to transmit far ultraviolet light; or when using $F_2$ laser and X-rays, reflective refractive optical system or refractive optical system (reflective type for reticle also) may be used; and, when using electron beams, optical system may use electron optical system based on electron lenses and polarizers. Here, it is obvious that the optical path for electron beams must be under a vacuum.

Also, the projection ratio of the projection optical system may be a reduction or magnification or equal size type.

Also, if a linear motor is used for the mask stage 111 or the substrate stage 130, it may be any one of air-levitated types based on air bearing, or a Lorenz force type or a magnetic floating type based on reactance force. Also, the mask stage or substrate stage may be a guided type to move along guide rails or a guideless type.

Also, if a planar motor is used for driving the stages, one of either the magnet unit (permanent magnet) or the armature unit should be mounted on the stage, and the other component of the magnetic unit or armature unit to the moving surface side (base) of the stage.

Also, the reactant force generated by the movement of the wafer stage can be dissipated mechanically through the frame members to the floor (ground), as recited in a Japanese Patent Application, First Publication, Hei 8-166475 (U.S. Pat. No. 5,528,118). The present invention is applicable to an exposure apparatus having such a structure.

Also, the reactant force generated by the movement of the reticle stage can be dissipated mechanically through the frame members to the floor (ground), as recited in a Japanese Patent Application, First Publication, Hei 8-330224 (U.S. Ser. No. 08/416,558). The present invention is applicable to an exposure apparatus having such a structure.

The exposure apparatus of the present invention is manufactured by assembling various sub-systems, that include the various structural elements disclosed in the claims of the present invention, so as to maintain the required levels of mechanical, electrical and optical precision. To achieve the required degrees of precision in the various sub-systems, apparatus assembly operation are preceded and followed by various inspection/adjustment steps to assure optical precision of the optical systems, mechanical precision of the mechanical systems, and electrical precision of the electrical systems. Assembly of the exposure system is preceded by assembling of various sub-systems to respective specification, so that the exposure apparatus may be assembled by mutual connections of sub-systems involving mechanical connections, wiring of electrical circuits and connections associated with pressure piping. Needless to say, before the assembling steps for various subsystems into an exposure apparatus, there are assembling steps for various subsystems. When the final assembly of sub-systems into the exposure apparatus is completed, individual subsystems are adjusted within the operating environment of the overall adjustments to assure overall precision of the exposure apparatus. Assembly operation for the exposure apparatus should be performed in a cleanroom environment.

Figure 17:
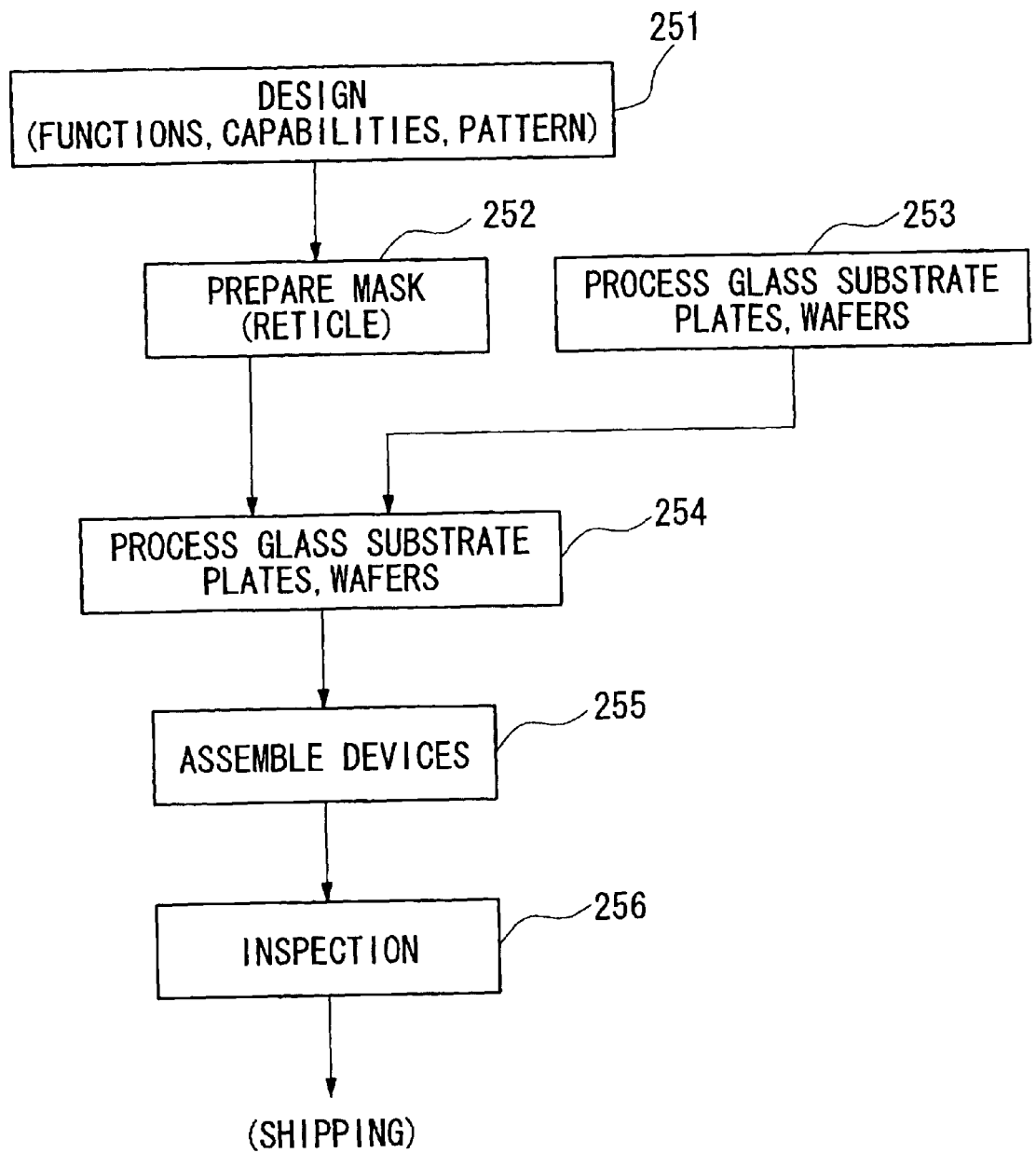
FIG. 17 is an example of the flowchart for a process of semiconductor device manufacturing.
Figure 18:
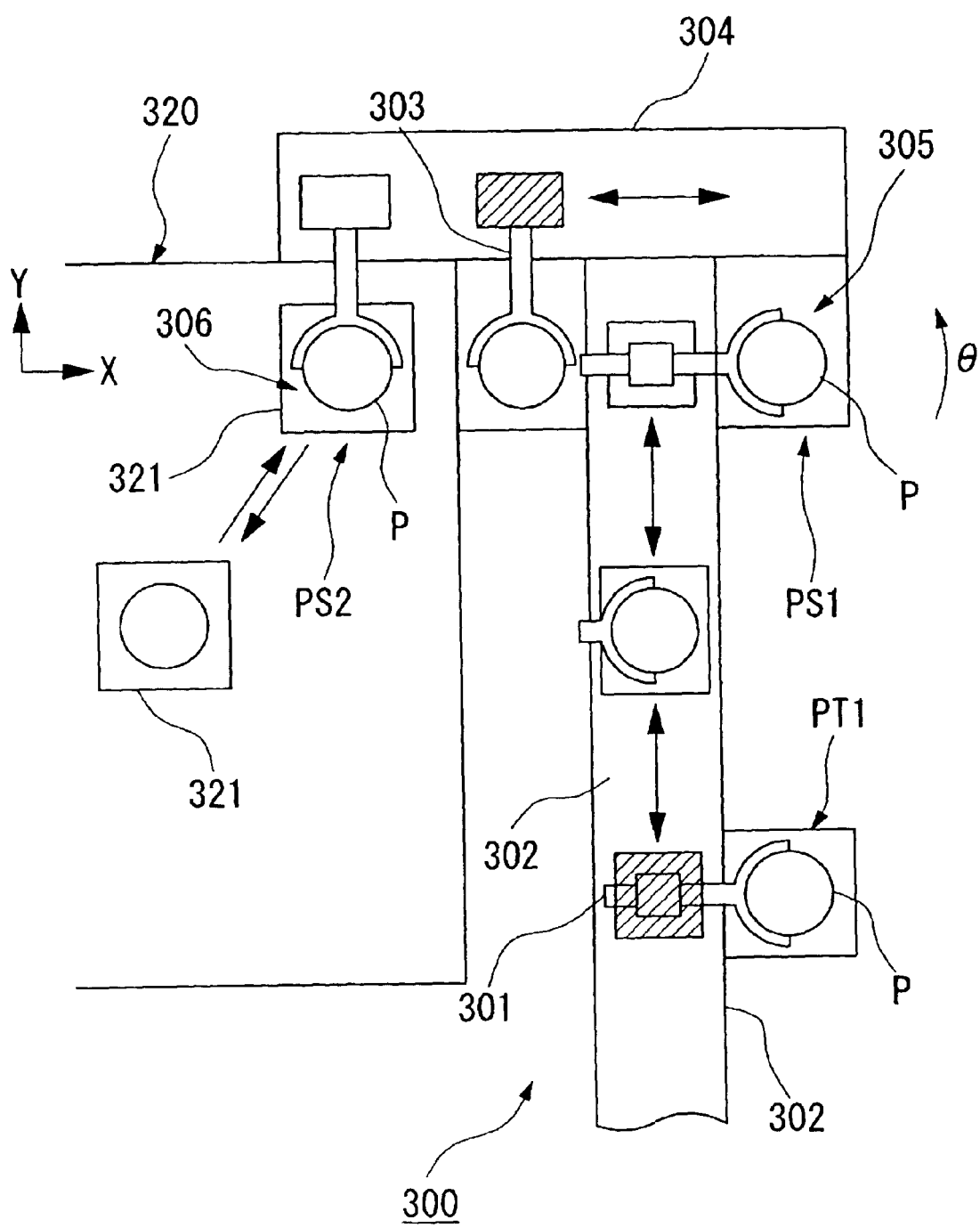
FIG. 18 is a diagram to explain the conventional substrate transport apparatus, positioning method and exposure apparatus.

Also, the flowchart shown in FIG. 17 relates to an example of the processing steps for manufacturing of semiconductor devices and others. The process is represented by: step 251 for designing functions and capabilities of the device; step 252 for producing a masking pattern (reticle) according to the design; step 253 for producing substrate plate (glass substrate, wafers and the like) from raw materials; step 254 for processing the substrate by exposing the pattern of the mask on the substrate plate to constitute a photolithographic step; step 255 for assembling a device (such as dicing, bonding, packaging and other processes); and step 256 for inspecting the assembled device. The use of the techniques described in the preceding embodiments enables to fabricate patterns on the devices with high precision and to improve the accuracy of the devices.

What is claimed is:

1. A method for transporting a substrate plate along a transport plane by:
   inducing electric charges in the substrate plate by impressing a voltage on each of a plurality of electrodes arranged along the transport plane, and impressing a voltage on each of the plurality of electrodes so as to generate an electrode charge code identical to a plate charge code induced in the substrate plate to levitate the substrate plate against the transport plane by electrostatic forces; and
   switching the voltage impressed on the plurality of electrodes in accordance with a time interval required for producing dielectric polarization in the substrate plate.

2. A method according to claim 1, wherein the voltage is switched so that a voltage switching cycle is shorter than a polarization time constant of the substrate plate.

3. A method according to claim 1, wherein a gas for levitating the substrate plate is supplied between the substrate plate and the transport plane.

4. A transporting apparatus that transports a substrate plate along a transport plane comprising:
   a plurality of electrodes arranged along the transport plane; and
   a control apparatus that induces electric charges in the substrate plate by impressing a voltage on each of a plurality of electrodes arranged along the transport plane, and impresses a voltage on each of the plurality of electrodes so as to generate an electrode charge code identical to a plate charge code induced in the substrate so as to levitate the substrate plate against the transport plane by electrostatic forces, and switches the voltage impressed on the plurality of electrodes in accordance with a time interval required for producing dielectric polarization in the substrate plate.

5. A transporting apparatus according to claim 4, wherein a plurality of second electrodes are arranged at right angles to a direction of the electrodes on the transport plane.

6. A transporting apparatus according to claim 5, wherein said second electrodes are arranged on both lateral sides of the electrodes.

7. A transporting apparatus according to claim 4, wherein an insulating member is disposed between the substrate plate and the transport plane.

8. A transporting apparatus according to claim 4, wherein a gas supply apparatus is provided at least on the substrate plate.

9. A method for positioning a substrate plate on a specific plane comprising:
   a first step of inducing electric charges in the substrate plate by impressing a voltage on each of a plurality of electrodes arranged on the plane;
   a second step of impressing a voltage, that is different from the voltage impressed in the first step, on each of the plurality of electrodes so as to levitate the substrate plate against the plane by electrostatic forces; and
   a third step of moving the substrate plate in a specific direction while switching the voltage impressed on the plurality of electrodes.

10. A method for positioning according to claim 9, wherein, in the third step, the voltage is switched in accordance with a time interval required for producing dielectric polarization in the substrate plate.

11. A method for positioning according to claim 9, wherein said method comprises a fourth step of electrostatic chucking the substrate plate by electrostatic forces on the plane that has been moved to a specific position.

12. A method for positioning according to claim 9, wherein a gas for levitating the substrate plate is supplied between the substrate plate and the plane.

13. A positioning apparatus that positions a substrate plate on a specific plane comprising:
   a plurality of electrodes arranged along the plane; and
   a control apparatus that induces electric charges in the substrate plate by impressing a voltage on each of the plurality of electrodes so as to levitate the substrate plate against the plane by electrostatic forces, and then switches the voltage impressed on each of the plurality of electrodes in accordance with a time interval required for producing dielectric polarization in the substrate plate.

14. A positioning apparatus according to claim 13, wherein provided are: a first electrode section having the plurality of first electrodes arranged in a first direction, and a second electrode section having the plurality of second electrodes arranged in a second direction which is at right angles to the first direction.

15. A positioning apparatus according to claim 14, wherein second electrode sections are distributed in separate groups in a direction at right angles to the second direction.

16. A positioning apparatus according to claim 13, wherein an insulating member is disposed between the substrate plate and the plane.

17. A positioning apparatus according to claim 13, wherein a gas supply apparatus that supplies a gas between the substrate plate and the plane.

18. A method for holding a substrate plate on a holding surface, wherein a method for positioning recited in claim 9 is used to position the substrate plate on the holding surface.

19. A holding apparatus that holds a substrate plate on a holding surface, wherein a positioning apparatus recited in claim 13 is provided for positioning the substrate plate on the holding surface.

20. A method for exposure having a step of emitting an illumination light for exposure processing, wherein the substrate plate is transported to a path of the illumination light according to a method for transporting a substrate plate recited in claim 1.

21. A method for exposure comprising a step of emitting an illumination light; and a step of positioning a substrate plate in a path of the illumination light according to a method of positioning recited in claim 9.

22. A method for exposure comprising a step of emitting an illumination light for exposure processing; and a step of positioning a substrate plate in a path of the illumination light according to the method for holding a substrate plate recited in claim 18.

23. An exposure apparatus comprising an illumination system that emits an illumination light for exposure processing; and a transport apparatus recited in claim 4 that transports a substrate plate to a path of the illumination light.

24. An exposure apparatus comprising an illumination system that emits an illumination light for exposure processing; and a positioning apparatus recited in claim 13 that positions a substrate plate disposed in a path of the illumination light.

25. An exposure apparatus comprising an illumination system that emits an illumination light for exposure processing; and the substrate holding apparatus recited in claim 19 that holds a substrate plate held in a path of the illumination light.

26. A method for manufacturing a device including a photolithographic step, wherein the photolithographic step is carried out according to a method of exposure recited in claim 20.

27. A device having a specific fabricated pattern, manufactured by using an exposure apparatus recited in claim 23.

28. A method for manufacturing a device including a photolithographic step, wherein the photolithographic step is carried out according to a method of exposure recited in claim 21.

29. A method for manufacturing a device including a photolithographic step, wherein the photolithographic step is carried out according to a method of exposure recited in claim 22.

30. A device having a specific fabricated pattern, manufactured by using an exposure apparatus recited in claim 24.

31. A device having a specific fabricated pattern, manufactured by using an exposure apparatus recited in claim 25.

* * * * *